(12) United States Patent
Ritala et al.

(10) Patent No.: US 12,230,506 B2
(45) Date of Patent: *Feb. 18, 2025

(54) AREA SELECTIVE ORGANIC MATERIAL REMOVAL

(71) Applicant: ASM IP HOLDING B.V., Almere (NL)

(72) Inventors: Mikko Ritala, Espoo (FI); Chao Zhang, Helsinki (FI); Markku Leskelä, Espoo (FI)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/319,330

(22) Filed: May 17, 2023

(65) Prior Publication Data
US 2023/0307247 A1 Sep. 28, 2023

Related U.S. Application Data

(63) Continuation of application No. 17/353,491, filed on Jun. 21, 2021, now Pat. No. 11,694,903.

(60) Provisional application No. 63/132,046, filed on Dec. 30, 2020, provisional application No. 63/043,604, filed on Jun. 24, 2020.

(51) Int. Cl.
| *H01L 21/311*  | (2006.01) |
| *H01L 21/02*   | (2006.01) |
| *H01L 21/033*  | (2006.01) |
| *H01L 21/285*  | (2006.01) |
| *H01L 21/306*  | (2006.01) |
| *H01L 21/3105* | (2006.01) |

(52) U.S. Cl.
CPC .... *H01L 21/31138* (2013.01); *H01L 21/0228* (2013.01); *H01L 21/0337* (2013.01); *H01L 21/28562* (2013.01); *H01L 21/30604* (2013.01); *H01L 21/31051* (2013.01); *H01L 21/31127* (2013.01)

(58) Field of Classification Search
None
See application file for complete search history.

(56) References Cited

U.S. PATENT DOCUMENTS

| 10,273,584 B2 | 4/2019  | Blomberg et al. |
| 10,280,519 B2 | 5/2019  | Blomberg et al. |
| 10,283,319 B2 | 5/2019  | Blomberg et al. |
| 10,343,186 B2 | 7/2019  | Pore et al.     |
| 10,373,820 B2 | 8/2019  | Tois et al.     |
| 10,453,701 B2 | 10/2019 | Tois et al.     |
| 10,695,794 B2 | 6/2020  | Pore et al.     |
| 10,872,765 B2 | 12/2020 | Tois et al.     |
| 10,900,120 B2 | 1/2021  | Sharma et al.   |

(Continued)

FOREIGN PATENT DOCUMENTS

JP S56-167330 A 12/1981

*Primary Examiner* — Jiong-Ping Lu
(74) *Attorney, Agent, or Firm* — Banner & Witcoff, Ltd.

(57) ABSTRACT

Aspects of this disclosure relate to selective removal of material of a layer, such as a carbon-containing layer. The layer can be over a patterned structure of two different materials. Treating the layer to cause the removal agent to be catalytically activated by a first area of the patterned structure to remove material of the organic material over the first area at a greater rate than over a second area of the patterned structure having a different composition from the first area.

20 Claims, 8 Drawing Sheets

(56) References Cited

U.S. PATENT DOCUMENTS

| | | | |
|---|---|---|---|
| 10,923,342 B2* | 2/2021 | Osaki | C08F 297/026 |
| 10,937,645 B2 | 3/2021 | Färm | |
| 11,643,728 B2 | 5/2023 | Hämäläinen et al. | |
| 11,694,903 B2* | 7/2023 | Ritala | H01L 21/28562 |
| | | | 438/738 |
| 2017/0267926 A1 | 9/2017 | Asano | |
| 2017/0323776 A1 | 11/2017 | Färm et al. | |
| 2018/0151345 A1 | 5/2018 | Haukka et al. | |
| 2018/0233350 A1 | 8/2018 | Tois et al. | |
| 2020/0051813 A1 | 2/2020 | Osaki et al. | |
| 2020/0148845 A1 | 5/2020 | Osaki | |
| 2021/0175088 A1 | 6/2021 | Dezelah et al. | |
| 2021/0407818 A1 | 12/2021 | Ritala et al. | |

* cited by examiner

51 — Provide substrate with first and second area covered with carbon-containing material in a reaction space 52 — Heat substrate to remove carbon-containing material from first area

53 — Form carbon-containing material over substrate comprising a first area and a second area 51 — Provide substrate with first and second area covered with carbon-containing material in a reaction space 52 — Heat substrate to remove carbon-containing material from first area

51 — Provide substrate with first and second area covered with carbon-containing material in a reaction space 52 — Heat substrate to remove carbon-containing material from first area 54 — Deposit target material on first area

AREA SELECTIVE ORGANIC MATERIAL REMOVAL

REFERENCE TO RELATED APPLICATIONS

The present application is a continuation of U.S. patent application Ser. No. 17/353,491, filed Jun. 21, 2021, now U.S. Pat. No. 11,694,903, which claims the benefit of priority of U.S. Provisional Application No. 63/132,046, filed Dec. 30, 2020, and also claims the benefit of priority of U.S. Provisional Application No. 63/043,604, filed Jun. 24, 2020, the disclosures of each which are hereby incorporated herein by reference in their entireties.

BACKGROUND

Technical Field

Embodiments of this disclosure generally relate to forming a patterned carbon-containing layer, such as an organic layer and, more specifically, to selectively removing carbon-containing material to form a patterned carbon-containing layer.

Description of Related Technology

Carbon-containing films, such as organic thin films, have a variety of desirable properties and are used in a variety of industries, such as in the electronics industry. Polymer films are examples of organic thin films, which in the microelectronics and photonics industries include, among other examples, photon- or electron-curable/degradable polymers for lithographic patterning and polyimides for packaging, interlayer dielectrics, and flexible circuit boards.

Polymer thin films can be used, for example, as a starting point in semiconductor applications for amorphous carbon films or layers. Polyimide films are an example a polymer film that can provide desirable thermal stability and resistance to mechanical stress and chemicals. For example, polyimide films can also be used as antireflection layers to improve pattern definition and reduce misalignment in lithography steps, as layers in multiple patterning, as insulating materials for interlayer dielectric materials, as the gate dielectric in all-organic thin film transistors, as passivation films in packaging applications, etc. Similarly, polyamide and other organic films are desirable for their electrical properties and material properties for numerous applications. Polyamide films may be used, for example, as insulating materials for interlayer dielectric materials in integrated circuit fabrication, and the photosensitivity of polyamide through ultraviolet (UV) curing allows patterning without separate photoresist.

Additionally, polymer and other organic films, such as polyimide, poly(methyl methacrylate) (PMMA), polyamide or self-assembled monolayers (SAMs), are useful as sacrificial materials during patterning in semiconductor fabrication. For example, many selective deposition processes are available that selectively deposit on one material (e.g., silicon, metallic material, inorganic dielectrics like silicon oxide and silicon nitride) with minimal or no deposition on organic materials. Accordingly, patterned organic materials can serve as passivation layers to facilitate subsequent selective deposition, enabling patterned layer formation without expensive photolithography processes after the deposition. In such situations, the organic material itself should be patterned to accomplish the desired inverse pattern for the subsequent deposition, and it would be very useful to be able to selectively form the patterned organic passivation layer without requiring photolithography for that step.

In a variety of applications, organic films, such as polymer films, are patterned over a substrate. A need exists for improved techniques for forming patterned inhibition layers, such a s polymer films.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of the current disclosure is a method of selectively removing carbon-containing material from a substrate. The method comprises providing a substrate in a reaction space, the substrate having a patterned structure thereon and a carbon-containing film over first and second areas of the patterned structure. The patterned structure comprises a first material comprising a removal-enhancing material in the first area and a second material of a chemically different composition from the removal-enhancing material in the second area. The method comprises treating the substrate to cause the removal-enhancing material to enhance the removal of carbon-containing material from the first area of the substrate relative to the second area.

In one aspect, a method of selective organic material removal is disclosed. The method comprises providing, in a reaction space, a substrate having a patterned structure thereon and an organic film over first and second areas of the patterned structure. The patterned structure comprises a first material comprising a catalytic material in the first area and a second material of a chemically different composition from the catalytic material in the second area. The method comprises exposing the organic layer to a vapor phase reactant in the reaction space such that the vapor phase reactant is activated by the catalytic material of the patterned structure to remove a material of the organic film at a greater rate over the first area compared to a rate of removal of the material of the organic film from over the second area.

In another aspect, a method of selectively removing organic material from a substrate is disclosed. The method comprises providing a substrate in a reaction space, the substrate having a patterned structure thereon and a removable film over first and second areas of the patterned structure. The patterned structure comprises a first material comprising a removal-enhancing material in the first area and a second material of a chemically different composition from the removal-enhancing material in the second area. The method comprises heating the substrate to cause the removal-enhancing material to enhance the removal of organic material from the first area of the substrate relative to the second area.

Another aspect of this disclosure is a system configured for selectively remove a carbon-containing material. The system comprises a reaction chamber configured to hold a substrate, a removal agent delivery system, and a controller in communication with the reactant delivery system. The substrate has a patterned structure thereon and a carbon-containing film over first and second areas of the patterned structure. The patterned structure comprises a first material comprising a removal-enhancing material in the first area and a second material different from the removal-enhancing material in the second area. The removal agent delivery system is configured to provide a removal agent capable of chemically removing a material of the carbon-containing film to the reaction chamber. The controller is programmed to cause the system to expose the carbon-containing layer to the reactant in the reaction chamber, and control conditions of the reaction chamber during exposing the carbon-containing layer to the removal agent such that a first rate of removal of the material of the carbon-containing film is greater in the first area compared to a second rate of removal of the material of the carbon-containing film in the second area. In some embodiments, the carbon-containing film is an organic film. In some embodiments, the carbon-containing film is an elemental carbon-containing film. In some embodiments, the removal-enhancing material is catalytic material.

In a yet another aspect, a system configured and arranged to selectively remove organic material from a substrate is disclosed. The system comprises a heating station configured to hold a substrate, wherein the substrate has a first area and a second area, and wherein the first and the second area are covered with organic material. The system further comprises a heating arrangement configured and arranged to heat the substrate for removing organic material from the substrate, and a controller in communication with the heating arrangement. The controller is programmed to cause the vapor deposition assembly to heat the substrate in the heating station to remove organic material from the substrate; and to control conditions of the heating station during heating of the substrate such that a first rate of removal of the organic material is greater on the first area compared to a second rate of removal of the organic material on the second area.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

FIGS. 5A, 5B, and 5C present flow chart illustrations of methods according to the current disclosure.

DETAILED DESCRIPTION OF CERTAIN EMBODIMENTS

Figure 1A:
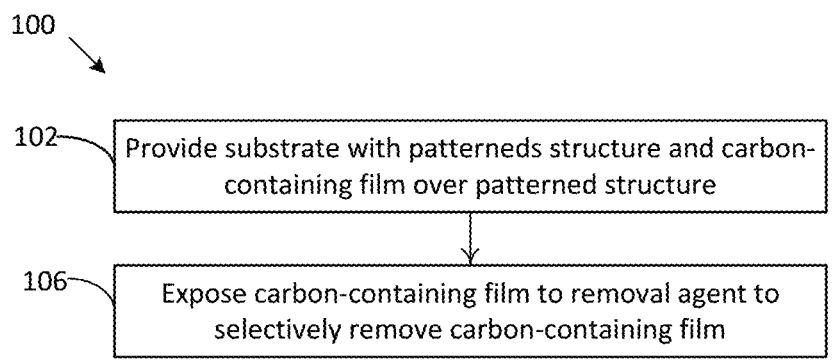
FIG. 1A is a process flow diagram for a method that includes forming a patterned organic film with selective removal of organic material according to an embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

As noted above, carbon-containing, such as organic layers are useful in forming and packaging semiconductor products, and can be employed in final products. Carbon-containing, such as organic layers may be useful in semiconductor processing to serve as sacrificial or temporary layers, for example as passivation against subsequent selective deposition on adjacent surfaces. Accordingly, it is useful to be able to selectively form carbon-containing layers on some materials relative to other materials, thereby selectively forming a carbon-containing passivating layer without photolithography. The selectively formed carbon-containing, such as organic, film can that be used, for example, as a passivation layer to enable a subsequent selective deposition on the regions where the carbon-containing material was selectively removed, relative to the regions where the carbon-containing material remains. Selectively formed carbon-containing, such as organic, passivation layers can increase the selectivity of a subsequent selective deposition of, e.g., a dielectric or metal material, because many deposition chemistries may be selective against carbon-containing surfaces. Of course, there may be many other uses for patterned carbon-containing, such as organic layers.

Carbon-containing films can be formed a variety of ways. For example, the carbon-containing film itself can be selectively deposited. Area selective deposition has been extensively studied for meeting specifications in the field of microelectronics. The capability to deposit a film, such as an organic film, on certain areas and not on other areas in a given device structure can eliminate patterning steps and/or misplacement errors. Selective deposition can contribute to a desirable yield for a manufacturing process. Examples of selective deposition of organic materials, particularly polymers, can be found, for example in U.S. Pat. No. 10,453,701, issued Oct. 22, 2019 to the applicant of the present application, the entire disclosure of which is incorporated herein by reference for all purposes.

Area selective deposition can involve having growth and non-growth areas on a substrate. These areas can be realized by passivating non-growth areas and/or by activating growth areas. It is generally desirable for growth and non-growth areas to result from different behavior of different respective areas already present in an underlying structure. A significant challenge in area selective deposition is that growth can begin in non-growth areas.

Embodiments disclosed herein relate to forming a patterned carbon-containing films, such as organic films by selective removal of carbon-containing material. A carbon-containing film, for example an organic film, such as a polymer film, can be deposited over a structure that contains chemically different areas. A first area of these chemically different areas can serve to enhance a removal reaction, such as decomposition, combustion, or hydrogenolysis reaction to remove material of the carbon-containing, such as organic film over the first area at a greater rate than over a second area of the chemically different areas. For example, a removal enhancing material may act as a catalyst in a removal reaction. This can cause material of the carbon-containing, such as organic, film to be completely removed over the first area while material of the carbon-containing, such as organic, film remains over the second area. The first area can comprise, for example, a noble metal to catalyze a removal agent. The second area can be less catalytic and/or non-catalytic when exposed to the removal agent at the conditions of interest (e.g., temperature). The difference in reactivity of the removal agent leads to selective removal of the carbon-containing material, which can be organic material, from over the catalytic material relative to the removal rate of the carbon-containing material from over the other, non-catalytic or less catalytic material.

In embodiments, carbon-containing layers, for example organic layers, such as polymers (e.g., polyimide, polyamide, or PMMA), can be deposited on two different surfaces, and selectively removed from one of the surfaces through catalytic oxidation. For example, the removal agent can comprise $O_2$ and/or other oxygen-containing compounds can have low reactivity with the carbon-containing, such as organic, material under the process conditions, but higher reactivity over one of the surfaces that has catalytic effect for activating (e.g., dissociating) the oxygen-containing compound. For example, the catalytic surface can be a metal such as platinum or another noble metal, $CeO_2$, or another suitable soot combustion catalyst. The oxygen-containing compound can diffuse through the carbon-containing, such as organic layer to reach the underlying catalytic surface, dissociate to release/form reactive oxygen species (e.g., monoatomic oxygen or radicals). Carbon-containing, such as organic, material can be completely removed from over the catalytic surface with significantly less removal of the carbon-containing material from over the non-catalytic surface, such as silicon or silicon oxide, so that some carbon-containing material remains on one surface but is fully removed from the catalytic surface. The removal agent can also comprise other gaseous and/or vapor phase compounds with different removal reaction mechanisms. For example, the removal agent can comprise $H_2$, which can be catalytically activated for selective removal of carbon-containing material similar to $O_2$ but operates by a different removal reaction from the removal reaction of activated $O_2$. Systems arranged to perform the methods described herein are also disclosed.

In some embodiments, treating the substrate to cause the removal-enhancing material to enhance the removal of carbon-containing material from the first area of the substrate relative to the second area consists of heating. Heating may be performed under atmospheric pressure. Alternatively, heating may be performed under a reduced pressure. A pressure during heating may be about 500 Torr or below, or about 200 Torr or below, or about 100 Torr or below, or about 50 Torr or below, or about 10 Torr or below, or about 1 Torr or below. In some embodiments, a pressure during heating may be about 500 mTorr or below, or about 50 mTorr or below. The pressure used during heating may affect the way the substrate is heated. In some embodiments, a substrate may be heated by heating a substrate support. In some embodiments, a substrate may be heated by heated gas. In some embodiments, a substrate may be heated by infrared radiation.

A substrate may be heated in an inert atmosphere. In some embodiments, the substrate is heated in an atmosphere comprising, consisting essentially of, or consisting of molecular nitrogen ($N_2$). In some embodiments, the substrate is heated in an atmosphere comprising, consisting essentially of, or consisting of one or more noble gases, such as argon. In some embodiments, the substrate is heated in an atmosphere comprising, consisting essentially of, or consisting of molecular nitrogen and noble gases, such as argon. In some embodiments, the atmosphere in the heating station does not contain oxygen.

Removal of carbon-containing, such as organic, material from the substrate may release various substances. To avoid such substances from reacting again with the substrate or with the carbon-containing, such as organic, material on the substrate, the atmosphere may be purged. Purging may take place in pulses of providing and removing a gas.

A rate of removal of carbon-containing, such as organic, material from the first area being at least 2 times the rate of removal of the carbon-containing, such as organic, material from the second area may be desirable. Thus, in some embodiments, heating the substrate causes the removal-enhancing material to enhance the removal of carbon-containing, such as organic, material from the first area of the substrate at a rate of at least about 2 times relative to the second area. The removal rate of the carbon-containing, such as organic, material from the first area can be from about 1.25 to about 100 times the removal rate of the carbon-containing, such as organic, material from the second area. For example, the removal rate from the first area may be from about 1.5 to 50, from about 2 to 36 or from about 3 to 25 times the rate of removal from the second area. In other embodiments the removal rate of the carbon-containing, such as organic, material from the first area can be about 1.25 times higher or more, about 1.5 times higher or more, about 2 times higher or more, about 3 times higher or more, about 5 times higher or more, about 10 times higher or more, about 25 times higher or more or about 50 higher or more than the removal rate of the carbon-containing, such as organic, material from the second area. The relative rates of removal can be sufficiently different that material remains on the second area while being completely removed from the first area. In some embodiments, the carbon-containing, such as organic, material is completely removed from the first area by heating the substrate.

In the current disclosure, the first area and the second area of the substrate are chemically different. The first area and the second area may have variable composition, and the choice of material may only be limited based on the presence of removal-enhancing material on the first area. Thus, many different materials may be present in or on a first area and a second area. In some embodiments, the first area comprises dielectric material. In some embodiments, the dielectric material in or on the first area is silicon oxide ($SiO_2$). In some embodiments, the dielectric material in or on the first area is a high k material. In some embodiments, the dielectric material in or on the first area is a low k material. In some embodiments, the first area comprises a metal. In some embodiments, the first area comprises a metallic material. In some embodiments, the second area comprises dielectric material. In some embodiments, the dielectric material in or on the second area is silicon oxide. In some embodiments, the dielectric material in or on the second area is a high k material. In some embodiments, the dielectric material in or on the second area is a low k material. In some embodiments, the second area comprises a metal. In some embodiments, the second area comprises metallic material. A dielectric material may form a dielectric surface.

In some embodiments, the first area comprises a metal, while the second area comprises dielectric material. In some embodiments, the first area comprises a dielectric material, and the second area comprises dielectric material. The first area and the second area may comprise the same dielectric material. The first area and the second area may comprise different dielectric materials. In some embodiments, the first area may comprise a metal, and the second area may comprise a metal. The first area and the second area may comprise the same metal. The first area and the second area may comprise different metals.

In some embodiments, the second area comprises, consists essentially of, or consist of silicon oxide ($SiO_2$). In some embodiments, the second area comprises, consists essentially of, or consist of low k material. In some embodiments, the second area comprises, consists essentially of, or consist of high k material. In some embodiments, the second area comprises a metal oxide, nitride, carbide, boride, or combination thereof. For example, the second area may comprise one or more of ruthenium oxide, niobium carbide, niobium boride, niobium oxide, nickel oxide, cobalt oxide, molybdenum oxide, tungsten oxide, tungsten nitric carbide, tantalum nitride or titanium nitride. In some embodiments, the second area comprises, consists essentially of, or consist of aluminum oxide.

Additionally, a first area and a second area may be composed of areas of different composition. In other words, a first area may have areas that differ in composition from each other. A second area may have areas that differ in composition from each other. The common feature of the areas of a first area is that they contain a removal-enhancing material. The first area and the second area may have otherwise similar or same composition, and the chemical difference according to the current disclosure may lie only in the presence of a removal-enhancing material in or on the first area.

In some embodiments, removal-enhancing material according to the current disclosure comprises a transition metal. In some embodiments, removal-enhancing material according to the current disclosure consist essentially of, or consist of, a transition metal. In some embodiments, the transition metal is in elemental form. In some embodiments, the transition metal is reduced. In some embodiments, the transition metal is oxidized. In some embodiments, the transition metal may comprise surface oxidation. In some embodiments, a transition metal is a group 4 to 6 transition metal. In some embodiments, a transition metal is a group 8 to 11 transition metal. In some embodiments, a transition metal is titanium. In some embodiments, a transition metal is zirconium. In some embodiments, a transition metal is hafnium. In some embodiments, a transition metal is vanadium. In some embodiments, a transition metal is niobium. In some embodiments, a transition metal is tantalum. In some embodiments, a transition metal is chromium. In some embodiments, a transition metal is molybdenum. In some embodiments, a transition metal is tungsten. In some embodiments, a transition metal is manganese. In some embodiments, a transition metal is rhenium. In some embodiments, a transition metal is iron. In some embodiments, a transition metal is ruthenium. In some embodiments, a transition metal is cobalt. In some embodiments, a transition metal is rhodium. In some embodiments, a transition metal is iridium. In some embodiments, a transition metal is nickel. In some embodiments, a transition metal is copper. In some embodiments, a transition metal is zinc. In some embodiments, a transition metal is palladium. In some embodiments, a transition metal is gold. In some embodiments, a transition metal is platinum. In some embodiments, a transition metal is silver.

In some embodiments, the removal-enhancing material comprises a noble metal. In some embodiments, the removal-enhancing material consist essentially of, or consist of, a noble metal. Noble metals according to the current disclosure comprise ruthenium (Ru), rhodium (Rh), palladium (Pd), silver (Ag), osmium (Os), iridium (Ir), platinum (Pt), and gold (Au). In some embodiments, the noble metal is selected from platinum metals. Platinum metals according to the current disclosure comprise ruthenium (Ru), rhodium (Rh), palladium (Pd), osmium (Os), iridium (Ir), and platinum (Pt).

In some embodiments, the removal-enhancing material comprises a transition metal oxide. In some embodiments, the removal-enhancing material consist essentially of, or consist of a transition metal oxide. The oxide may be an oxide of any of the transition metals listed above. Thus, the transition metal oxide may be, for example, a titanium oxide, a zirconium oxide, a hafnium oxide, a vanadium oxide, a chromium oxide, a molybdenum oxide, a tungsten oxide, a manganese oxide, a rhenium oxide, a ruthenium oxide, a cobalt oxide, a rhodium oxide, a nickel oxide, a palladium oxide, a platinum oxide, a copper oxide or a silver oxide. Transition metals may form oxides in various oxidation states, and the term oxide as used herein encompasses all suitable oxidation states.

In some embodiments, removal-enhancing material comprises aluminum. In some embodiments, removal-enhancing material comprises an aluminum oxide, such as $Al_2O_3$.

In the method according to the current disclosure a substrate having a first area and a second area is provided in a reaction space. The reaction space may be a heating station. In other words, a substrate is brought into space where conditions can be controlled. The reaction space, such as a heating station, may be part of a cluster tool in which different processes are performed to form an integrated circuit. In some embodiments, the reaction space, such as a heating station may be a flow-type reactor, such as a cross-flow reactor. In some embodiments, the reaction space, such as a heating station may be a showerhead reactor. In some embodiments, the reaction space, such as a heating station may be a space-divided reactor. In some embodiments, the reaction space, such as a heating station may be single wafer ALD reactor. In some embodiments, the reaction space, such as a heating station may be a high-volume manufacturing single wafer ALD reactor. In some embodiments, the reaction space, such as a heating station may be a reaction chamber in a batch reactor for manufacturing multiple substrates simultaneously. For clarity, selective removal of carbon-containing, such as organic, material according to the current disclosure may be performed in any suitable space in which temperature of the substrate and/or other conditions, can be controlled with sufficient accuracy, and in which the substrate can be treated, such as heated to high enough temperature. Thus, the reaction space, such as heating station, may be a reaction chamber for depositing material on a substrate. Conversely, the reaction space, such as heating station, according to the current disclosure does not need to be chamber suitable for vapor deposition reactions. The reaction space, such as heating station, for the purposes of the current disclosure may be, for example, a loadlock chamber. The reaction space, such as heating station, for the purposes of the current disclosure may be an annealing furnace. In some embodiments, the reaction space, such as heating station, comprises an exhaust. An exhaust may be used for removing substances produced during removal of carbon-containing, such as organic, material. In some embodiments, an exhaust avoids or reduces the buildup of substances produced during removal of carbon-containing, such as organic, material. In some embodiments, the reaction space, such as heating station, according to the current disclosure is connected to a pump to remove substances produced during removal of carbon-containing, such as organic, material.

In some embodiments, a substrate comprising a first area and a second area is heated. Heating may take place in a heating station. In some embodiments, heating comprises a thermal removal reaction. Heating causes the removal-enhancing material to enhance the removal of carbon-containing, such as organic, material from the first area of the substrate relative to the second area. In some embodiments, heating the substrate causes the removal-enhancing material to remove carbon-containing, such as organic, material from the first area of the substrate at a rate that is greater than a rate of removal of carbon-containing, such as organic, material from the second area. In some embodiments, the heating causes the removal of the carbon-containing, such as organic, material from over the first area substantially completely. In some embodiments, the heating causes the removal of the carbon-containing, such as organic, material from over the first area completely. Substantially complete removal means that there may be some residual carbon-containing, such as organic, material left on the first area after heating, but the remaining material does not prevent the further processing of the substrate. Depending on the embodiment, the residual carbon-containing, such as organic, material may not interfere with the further processing of the substrate, or it may be removed during the next processing step or steps.

In some embodiments, the substrate is heated at a temperature of from about 200° C. to about 500° C. In some embodiments, the substrate is heated at a temperature from about 200° C. to about 400° C., or from about 200° C. to about 350° C., or from about 200° C. to about 300° C., or from about 200° C. to about 250° C. In some embodiments, the substrate is heated at a temperature from about 250° C. to about 500° C., or from about 300° C. to about 500° C., or from about 350° C. to about 500° C., or from about 400° C. to about 500° C. In some embodiments, the substrate is heated at a temperature from about 250° C. to about 450° C., or from about 300° C. to about 400° C., or from about 350° C. to about 400° C. In some embodiments, the substrate is heated at a temperature of about 325° C., or at about 375° C.

The time to selectively remove carbon-containing, such as organic, material may depend on the rate of removal of the carbon-containing material, and thickness of the carbon-containing material. Thus, the duration of heating may be selected based on the thickness of a carbon-containing, such as organic, material, and on the rate of removal of the carbon-containing material from the first area. Rate of removal may be dependent on, for example, the composition of the carbon-containing material, and on the heating temperature.

In some embodiments, the rate of removal of carbon-containing, such as organic, material may be from 1 nm min$^{-1}$ to 9 nm min$^{-1}$, or from 1 nm min$^{-1}$ to 8 nm min$^{-1}$, or from 1 nm min$^{-1}$ to 6 nm min$^{-1}$, or from 1 nm min$^{-1}$ to 5 nm min$^{-1}$, or from 1 nm min$^{-1}$ to 3 nm min$^{-1}$. In some embodiments, the rate of removal of carbon-containing, such as organic, material may be from 2 nm min$^{-1}$ to 9 nm min$^{-1}$, or from 3 nm min$^{-1}$ to 9 nm min$^{-1}$, or from 4 nm min$^{-1}$ to 9 nm min$^{-1}$, or from 6 nm min$^{-1}$ to 9 nm min$^{-1}$, or from 3 nm min$^{-1}$ to 6 nm min$^{-1}$. The rate of removal may be higher than 9 nm min$^{-1}$ under some conditions and for some carbon-containing, such as organic, materials.

Thus, for a layer of 10 nm, the duration of the heating may be, for example from about 1 minute to about 15 minutes, and for a layer of 50 nm, the duration of the heating may be, for example from about 5 minutes to about 50 minutes, and for a layer of 100 nm, the duration of the heating may be, for example from about 10 minutes to about 150 minutes.

In some embodiments, the method further comprises forming the carbon-containing, such as organic, material over the substrate prior to treating, for example heating, the substrate. The carbon-containing, such as organic, material may be formed on the substrate comprising a first area and a second area directly prior to selectively removing carbon-containing, such as organic, material from the substrate through heating. Alternatively, carbon-containing, such as organic, material may be formed on the substrate well in advance of selective removal of carbon-containing, such as organic, material through heating. Forming carbon-containing, such as organic, material on the substrate may be performed in the same space, such as a reaction chamber, as selective removal of carbon-containing, such as organic, material. Alternatively, forming carbon-containing material and selectively removing carbon-containing material may be performed in different spaces. In some embodiments, forming carbon-containing, such as organic, material and selectively removing carbon-containing material may be performed in one cluster tool. In some embodiments, forming carbon-containing, such as organic, material and selectively removing carbon-containing material may be performed in different tools. In some embodiments, the carbon-containing, such as organic, material is formed over the substrate by spin-coating, dip-coating, molecular layer deposition, chemical vapor deposition or atomic layer deposition.

In some embodiments, a carbon-containing, such as organic, layer is formed over the substrate by a vapor deposition process. In some embodiments, the vapor deposition process for depositing carbon-containing material is a thermal process. In some embodiments, the vapor deposition process for depositing carbon-containing material is a plasma-free process. In some embodiments, carbon-containing, such as organic, material formed by vapor deposition comprises a polymer. In some embodiments the organic material comprises, consist essentially of, or consist of polyamide or polyimide. Other examples of deposited polymers include dimers, trimers, polyurethanes, polythioureas, polyurethane, polythiophene, polyesters, polyimines, other polymeric forms or mixtures of the above materials.

Cyclic deposition processes of polymers may produce high growth rates and be thus well suited for depositing carbon-containing, such as organic, material. A process for depositing carbon-containing, such as organic, material on a substrate comprising a first area and a second area may comprise one or more deposition cycles comprising contacting the substrate with a first carbon-containing, such as organic, precursor, and contacting the substrate with a second carbon-containing, such as organic, precursor. The first and the second carbon-containing precursor may be in vapor phase. In other words, the deposition of a carbon-containing, such as organic, material may be a vapor deposition process. Contacting the substrate with the first and second carbon-containing precursors forms carbon-containing material on the substrate. In some embodiments processes may further comprise repeating the contacting steps until a layer of desired thickness is achieved. Without limiting the current disclosure to any specific theory, the carbon-containing, such as organic, material may form a layer when only a few nanometers of the material are deposited on the substrate. However, when deposition is continued, the carbon-containing material may begin to accumulate to form a thicker layer on the substrate.

A vapor deposition process for depositing carbon-containing, such as organic, material may be a cyclic process. In some embodiments, the cyclic vapor deposition process for depositing carbon-containing material comprises supplying at least two carbon-containing, such as organic, precursors in an alternating and sequential manner into a reaction chamber. By a carbon-containing precursor is herein meant a precursor for forming carbon-containing material, and the term is not intended to limit the structure of the precursor itself.

In some embodiments, the vapor deposition process for depositing carbon-containing, such as organic, material is an ALD process. Thus, in some embodiments, the carbon-containing, such as organic, material is deposited by providing a first carbon-containing precursor and a second carbon-containing precursor in a reaction chamber alternately and sequentially. ALD-type processes are based on controlled, typically self-limiting surface reactions of the precursors and/or reactants. Gas phase reactions are avoided by feeding the precursors alternately and sequentially into a reaction chamber. Vapor phase precursors are separated from each other in a reaction chamber, for example, by removing excess precursors and/or precursor by-products from a reaction chamber between precursor pulses. This may be accomplished with an evacuation step and/or with an inactive gas pulse or purge. In some embodiments the substrate is contacted with a purge gas, such as an inactive gas. For example, the substrate may be contacted with a purge gas between precursor pulses to remove excess precursor and reaction by-products. In some embodiments each reaction is self-limiting and monolayer by monolayer growth is achieved. These may be referred to as "true ALD" reactions. In some such embodiments a first precursor may adsorb on the substrate surface in a self-limiting manner. A second precursor or a reactant, and optional further reactants or precursors will react in turn with the adsorbed first precursor to form up to a monolayer of a target compound on the substrate.

In some embodiments, the vapor deposition process for depositing carbon-containing, such as organic, material is a CVD process. CVD-type processes typically involve gas phase reactions between two or more precursors or reactants. The precursors or reactants can be provided simultaneously to a reaction chamber or substrate, or in partially or completely separated pulses. The substrate and/or reaction space can be heated to promote the reaction between the gaseous precursors. In some embodiments the precursors are provided until material having a desired thickness is deposited. Thus, a CVD-type process may be a cyclical process or a non-cyclical process. In some embodiments, cyclical CVD-type processes can be used with multiple cycles to deposit material having a desired thickness. In cyclical CVD-type processes, the precursors may be provided to a reaction chamber in pulses that do not overlap, or that partially or completely overlap. For clarity, in case heating the substrate to selectively remove carbon-containing, such as organic, material is performed in the same reaction chamber as depositing carbon-containing material, the reaction chamber for depositing carbon-containing material is the reaction space, such as heating station, according to the current disclosure.

The terms "precursor" and "reactant" can refer to molecules (compounds or molecules comprising a single element) that participate in a chemical reaction that produces another compound, and the terms are used interchangeably in the current disclosure. A precursor typically contains portions that are at least partly incorporated into the compound or element resulting from the chemical reaction in question. Such a resulting compound or element may be deposited on a substrate. A reactant may me an element or a compound that is not incorporated into the resulting compound or element to a significant extent. However, a reactant may also contribute to the resulting compound or element in certain embodiments.

In some embodiments, the substrate may be contacted with the second carbon-containing, such as organic, precursor before the substrate is contacted with the first carbon-containing, such as organic, precursor. Various precursors can be used for depositing carbon-containing material. For example, in some embodiments, the first carbon-containing precursor comprises a monomer with two reactive groups. In some embodiments, the first carbon-containing precursor comprises a diamine and/or a triamine. In some embodiments the substrate is contacted with the first carbon-containing precursor comprising a diamine before the substrate is contacted with another, different precursor. In some embodiments the first carbon-containing precursor comprises 1,6-diamnohexane (DAH). In some embodiments, one of the carbon-containing precursors is, for example, diethylene triamine, pentane 1,3,5 triamine, butane 1,2,4 triamine, and phenyl triamine.

In some embodiments, the second carbon-containing precursor comprises an anhydride. In some embodiments the second carbon-containing precursor comprises a dianhydride. In some embodiments the second carbon-containing precursor comprises pyromellitic dianhydride (PMDA). In some embodiments, the second reactant or precursor is also a carbon-containing, such as organic, reactant capable of reacting with adsorbed species of the first reactant under the deposition conditions. In some embodiments, the second carbon-containing precursor comprises furan-2,5-dione (maleic acid anhydride). In some embodiments, the second carbon-containing precursor comprises a monomer with two reactive groups which will react with the first reactant.

In some embodiments, the substrate is contacted with the first carbon-containing precursor prior to being contacted with the second carbon-containing precursor. Thus, in some embodiments, the substrate is contacted with an amine, such as a diamine, for example 1,6-diamnohexane (DAH) prior to being contacted with another precursor. However, in some embodiments the substrate may be contacted with the second carbon-containing precursor prior to being contacted with the first carbon-containing precursor. Thus, in some embodiments the substrate is contacted with an anhydride, such as furan-2,5-dione (maleic acid anhydride), or more particularly a dianhydride, e.g., pyromellitic dianhydride (PMDA) prior to being contacted with another precursor.

In some embodiments, a deposition of a carbon-containing, such as organic, material may begin with contacting the substrate with the first carbon-containing, such as organic, precursor, in other embodiments a process may begin with contacting the substrate with the second carbon-containing, such as organic, precursor.

In some embodiments, different reactants can be used to tune the carbon-containing, such as organic, layer properties. For example, a polyimide material could be deposited using 4,4'-oxydianiline or 1,4-diaminobenzene instead of 1,6-diaminohexane to get a more rigid structure with more aromaticity and increased dry etch resistance.

In some embodiments the carbon-containing, such as organic, precursors do not contain metal atoms. In some embodiments the carbon-containing precursors do not contain semimetal atoms. In some embodiments one of the carbon-containing precursors comprises metal or semimetal atoms. In some embodiments the carbon-containing precursors contain carbon and hydrogen and one or more of the following elements: N, O, S, P or a halide, such as Cl or F. In some embodiments the first carbon-containing precursor may comprise, for example, adipoyl chloride (AC).

Deposition conditions can differ depending upon the selected reactants and can be optimized upon selection. In some embodiments the reaction temperature can be selected from the range of about 80° C. to about 250° C. In some embodiments, for example where the carbon-containing, such as organic, material comprises polyimide, the reaction temperature can be selected from the range of about 170° C. to about 210° C. In some embodiments, for example where the deposited carbon-containing, such as organic, material comprises polyamide, the reaction temperature can be selected from a range of about 80° C. to about 150° C. In some embodiments where the deposited carbon-containing, such as organic, material comprises polyimide, the reaction temperature may be greater than about 160° C., 180° C., 190° C., 200° C., or 210° C. In some embodiments where the carbon-containing, such as organic, material comprises polyamide the reaction temperature may be greater than about 80° C., 90° C., 100° C., 110° C., 120° C., 130° C., 140° C., or 150° C. In some embodiments the substrate is held at a temperature of greater than about 170° C. during the one or more deposition cycles of depositing carbon-containing, such as organic, material. In some embodiments, a reaction chamber pressure may be from about 1 mTorr to about 100 Torr, or from about 1 mTorr to about 300 Torr during deposition of carbon-containing, such as organic, material.

In some embodiments the carbon-containing, such as organic, material comprises polyamide. In some embodiments the first carbon-containing precursor comprises a halogen. In some embodiments the first carbon-containing precursor comprises adipoyl chloride (AC). In some embodiments the second carbon-containing precursor comprises a diamine. In some embodiments the substrate is held at a temperature of greater than about 80° C. during the one or more deposition cycles of depositing carbon-containing, such as organic, material.

In some embodiments the first and/or second inhibitor material precursor exposure period is from about 0.01 seconds to about 60 seconds, from about 0.05 seconds to about 30 seconds, from about 0.1 seconds to about 10 seconds or from about 0.2 seconds to about 5 seconds. The optimum exposure period can be determined for each specific process. In some embodiments where batch reactors may be used, exposure periods of greater than 60 seconds may be employed.

Cyclic deposition may be repeated, for example from about 10 to about 2,000, or from about 100 to about 2,000, or from about 200 to about 2,000, or from about 500 to about 2,000, or from about 1,000 to about 2,000 times to deposit a suitable amount of carbon-containing, such as organic, material. In some embodiments, cyclic deposition may be repeated, for example from about 10 to about 50, or from about 10 to about 100, or from about 20 to about 500, or from about 10 to about 500, or from about 50 to about 1,000 times to deposit a suitable amount of carbon-containing, such as organic, material.

Excess of the first carbon-containing, such as organic, precursor (and any volatile reaction by-products) may then be removed from contact with the substrate before contacting the substrate with the second carbon-containing, such as organic, precursor. In cyclic deposition processes, and depending on the order of exposure of the substrate, excess of the second carbon-containing, such as organic, precursor (and any volatile reaction by-products) may then be removed from contact with the substrate before contacting the substrate with the first carbon-containing precursor. Such removal can be accomplished by, for example, purging, pump down, moving the substrate away from a chamber or zone in which it is exposed to the first reactant, or combinations thereof. In some embodiments a first precursor removal period, for example a purge period, is from about 0.01 seconds to about 60 seconds, about 0.05 seconds to about 30 seconds, about 0.1 seconds to about 10 seconds or about 0.2 seconds to about 5 seconds. In some embodiments where batch reactors may be used, removal periods of greater than 60 seconds may be employed.

In some embodiments, carbon-containing, such as organic, material deposition may comprise depositing polyamide in a on a substrate comprising a first area and a second area. In some embodiments depositing polyamide comprises a vapor deposition process. In some embodiments depositing polyamide comprises molecular layer deposition (MLD) process. In some embodiments, depositing carbon-containing, such as organic, material comprises a CVD process. In some embodiments, depositing a layer comprises a CVD process. In some embodiments, depositing carbon-containing, such as organic, material comprises an ALD process. In some embodiments, depositing a layer comprises an ALD process.

In some embodiments, carbon-containing, such as organic, material is deposited so that the carbon-containing material substantially covers the substrate. In some embodiments, the carbon-containing, such as organic, material covers the substrate. In some embodiments, the thickness of the carbon-containing, such as organic, material is at least 0.5 nm. In some embodiments, the thickness of the carbon-containing, such as organic, material is at least 1 nm. In some embodiments, the thickness of the carbon-containing, such as organic, material is at least 5 nm. In some embodiments, the thickness of the carbon-containing, such as organic, material is at least 10 nm. In some embodiments, the thickness of the carbon-containing, such as organic, material is at least 50 nm.

In some embodiments, the carbon-containing, such as organic, layer is deposited on a substrate comprising a first area and a second area by spin-coating. In some embodiments, the carbon-containing, such as organic, layer is deposited on a substrate comprising a first area and a second area by dip-coating. In some embodiments, the carbon-containing, such as organic, layer deposited on the substrate by spin-coating is PMMA (poly(methyl methacrylate)).

In some embodiments, the method further comprises selectively depositing a target material over the first area relative to the second area after heating the substrate. In such embodiments, the method may comprise forming carbon-containing, such as organic, material on the substrate comprising the first area and the second area. Alternatively, forming of carbon-containing, such as organic, material may be absent from the method according to the current disclosure.

The target material may be selectively deposited on the first area directly after selectively removing carbon-containing, such as organic, material from the substrate through heating. Alternatively, target material may be deposited on the first area some time after selective removal of carbon-containing, such as organic, material through heating. Depositing target material on the first area may be performed in the same space as selective removal of target material. Thus, the two processes may take place in the same reaction chamber. Alternatively, selectively removing target material and selectively depositing target material may be performed in different spaces, or reaction chambers. In some embodiments, selectively removing target material and selectively depositing target material may be performed in one cluster tool. In some embodiments, selectively removing target material and selectively depositing target material may be performed in different tools.

The target material deposited on the first area may be any suitable material used in the art of semiconductor device manufacturing. A target material layer according to the current disclosure may thus comprise various materials. In some embodiments, target material comprises, consist essentially of, or consist of a dielectric material. In some embodiments, the dielectric material comprises a low k material. In some embodiments, the dielectric material comprises a high k material. In some embodiments, target material comprises, consist essentially of, or consist of a metal oxide. In some embodiments, target material comprises, consist essentially of, or consist of aluminum oxide (such as $Al_2O_3$). In some embodiments, target material comprises, consist essentially of, or consist of zirconium oxide (such as $ZrO_2$). In some embodiments, target material comprises, consist essentially of, or consist of titanium oxide (such as $TiO_2$). In some embodiments, target material comprises, consist essentially of, or consist of a metal nitride. In some embodiments, target material comprises, consist essentially of, or consist of a titanium nitride (such as TiN). In some embodiments, the target material comprises, consist essentially of, or consist of a metal carbide. In some embodiments, the target material comprises, consist essentially of, or consist of a metal boride.

In some embodiments, the target material comprises silicon. In some embodiments, target material comprises, consists essentially of, or consists of silicon oxide (such as $SiO_2$). The silicon-containing target material may comprise substantially only silicon oxide, such as $SiO_2$. The silicon-containing material may comprise boron-doped silicon oxide, phosphorus-doped silicon oxide, silicon, poly-silicon, silicon carbides, and silicon nitrides.

In some embodiments, target material comprises, consist essentially of, or consist of a metal. In some embodiments, target material comprises, consists essentially of, or consists of a metallic material. In some embodiments, target material comprises, consists essentially of, or consists of an elemental metal. In some embodiments, target material comprises, consists essentially of, or consists of a metal alloy. Since the first area may comprise a metal, metallic material or dielectric material, the selective deposition of target material may be any of metal-on-metal (MoM) selective deposition, dielectric-on-metal selective deposition (DoM), metal-on-dielectric (MoD) selective deposition or dielectric-on-dielectric selective deposition (DoD).

In some embodiments, the target material is deposited by a vapor deposition process. The vapor deposition process of the target material may be a cyclic process. In some embodiments, the target material is deposited on the first area by chemical vapor deposition or atomic layer deposition. In some embodiments, target material is deposited by providing a first material precursor and a second material precursor in a reaction chamber alternately and sequentially. In some embodiments, the vapor deposition process for depositing target material is a thermal process. In some embodiments, the vapor deposition process for depositing target material is a plasma-free process. The precursors and deposition conditions vary broadly according to the target material in question, as is known to those skilled in the art.

In the current disclosure, deposition of target material is selective. Thus, the target material deposited is selectively deposited on the first area relative to the second area. Selectivity may be complete or partial. Selectivity can be given as a percentage calculated by [(deposition on deposition area)-(deposition on inhibition material)]/(deposition on the deposition area). Deposition can be measured in any of a variety of ways. In some embodiments, deposition may be given as the measured thickness of the deposited material. In some embodiments, deposition may be given as the measured amount of material deposited.

In some embodiments selectivity is greater than about 20%, greater than about 50%, greater than about 75%, greater than about 85%, greater than about 90%, greater than about 93%, greater than about 95%, greater than about 98%, greater than about 99% or even greater than about 99.5%. In embodiments described herein, selectivity can change over the duration or thickness of a deposition.

The target material may be deposited to form a layer. The target material may be a functional layer of a semiconductor device. In some embodiments, the deposited target material is a sacrificial layer. In some embodiments, the deposited target material is an etch-stop layer. An etch-stop layer may comprise aluminum oxide.

After depositing target material, the carbon-containing, such as organic, material may be substantially completely or completely removed. Alternatively, additional layers may be selectively deposited over the target material before removal of the carbon-containing, such as organic, material. In some embodiments, the remaining carbon-containing, such as organic, material may stay on the substrate. Thus, the carbon-containing, such as organic, material may form a part of a final device. Further, in some embodiments, the carbon-containing, such as organic, layer may be removed at a later point, and it may, for example, function as a protective layer on the second area until a pre-determined further processing step is performed.

In some embodiments, additional treatments, such as heat or chemical treatment, can be conducted prior to, after or between the foregoing processes. For example, treatments may modify the surfaces or remove portions of the surfaces exposed at various stages of the process. In some embodiments, the substrate may be pretreated or cleaned prior to or at the beginning of the method according to the current disclosure. In some embodiments, the substrate may be subjected to a plasma cleaning process at prior to or at the beginning of the method according to the current disclosure. In some embodiments, the substrate surface may be exposed to hydrogen plasma, radicals, or atomic species prior to or at the beginning of the process according to the current disclosure. In some embodiments, a pretreatment or cleaning process may be carried out in the same space as the main process. However, in some embodiments, a pretreatment or cleaning process may be carried out in a separate space, which may be a reaction chamber.

In an aspect, a system configured and arranged to selectively remove carbon-containing, such as organic, material from a substrate is disclosed. The system comprises a heating station configured to hold a substrate, wherein the substrate has a first area and a second area, and wherein the first and the second area are covered with carbon-containing, such as organic, material. The system further comprises a heating arrangement configured and arranged to heat the substrate for removing carbon-containing, such as organic, material from the substrate, and a controller in communication with the heating arrangement. The controller is programmed to cause the system to heat the substrate in the heating station to remove carbon-containing, such as organic, material from the substrate, and to control conditions of the heating station during heating of the substrate such that a first rate of removal of the carbon-containing, such as organic, material is greater on the first area compared to a second rate of removal of the carbon-containing, such as organic, material on the second area. In some embodiments, the controller is programmed to cause the system to perform the method according to the current disclosure. In some embodiments, the system is a part of a vapor deposition assembly. For example, the system may be a part of a cluster tool. The vapor deposition assembly may be configured and arranged to form carbon-containing, such as organic, material on a substrate according to the current disclosure. In such embodiments, the vapor deposition assembly may comprise the necessary source vessels for carbon-containing, such as organic, precursors for forming the carbon-containing, such as organic, material on the substrate, and other features present in such a vapor deposition assembly. In some embodiments, the heating station is a loadlock chamber. In addition or alternatively to forming carbon-containing, such as organic, material on a substrate, the vapor deposition assembly may be configured and arranged to deposit target material on a substrate according to the current disclosure. In such embodiments, the vapor deposition assembly may comprise the necessary source vessels for material precursors for depositing the target material on the substrate, and other features present in such a vapor deposition assembly.

Embodiments disclosed herein provide a robust alternative to selective deposition for selectively forming carbon-containing, such as organic, films. By forming patterned carbon-containing, such as organic, films with selective removal of carbon-containing material disclosed herein, advantages can be achieved. For example, selective removal as taught herein can achieve selective formation for carbon-containing films initially formed by numerous techniques, including blanket deposition techniques, non-selectively forming carbon-containing films, imperfectly selective vapor deposition, spin-on deposition, dip-coating, etc. This opens the door to selective formation of carbon-containing, such as organic, films of a variety of different materials, using a variety of precursors, and under less stringent conditions than selective deposition. Catalytic activity of an area of a patterned structure below a carbon-containing film can provide selectivity for removing material of a carbon-containing film to thereby form a patterned carbon-containing film in accordance with the principles and advantages disclosed herein. The selective removal of carbon-containing, such as organic, material can advantageously utilize different behavior of different respective areas already present in a structure before forming a carbon-containing film.

FIG. 1A is a process flow diagram for a method 100 that includes forming a patterned carbon-containing, such as organic film with selective removal of carbon-containing material according to an embodiment. In certain applications, the method 100 can be part of a semiconductor manufacturing process. The method 100 can be performed in one or more reaction spaces (i.e. reaction chambers). The method 100 can be performed using the system of FIG. 4, for example. The method 100 can include additional operations. The method 100 can be readily extended to more complex processes.

Figure 2A:
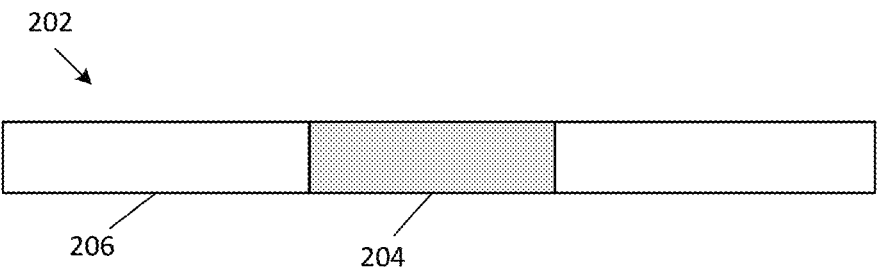
FIG. 2A is a schematic cross sectional diagram illustrating a patterned structure on a substrate.
Figure 3A:
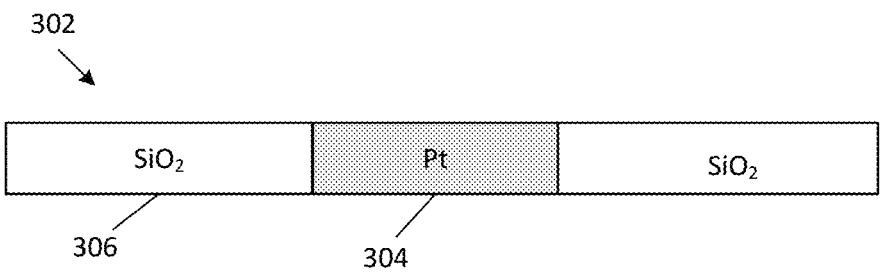
FIG. 3A is a schematic cross sectional diagram illustrating a patterned structure on a substrate, in which the patterned structure includes a noble metal and a silicon oxide.

At block 102, a substrate with a patterned structure and a carbon-containing film, such as organic film over the patterned structure is provided at block 102. Examples of the patterned structure are shown in FIGS. 2A and 3A. The patterned structure includes a first material in a first area and a second material in a second area.

The first material comprises a catalytic material capable of activating a removal agent under the conditions of block 106 described below. The catalytic material can be a noble metal. For example, the catalytic material can be platinum. The catalytic material can comprise a metal oxide. The catalytic material can comprise a soot combustion catalyst, such as an oxide used as a soot combustion catalyst. Examples of oxide catalysts for oxidation include $V_2O_5$, iron oxide, cobalt copper oxide, molybdenum oxide, tungsten oxide, the like, and other mixed and/or doped oxides. The catalytic material can comprise $CeO_2$. In some embodiments, a pattern of metal and non-metal regions can be selectively provided with catalytic material over the metal, e.g., by electroplating, electroless plating, selective deposition, etc.

The second material has a chemically different composition than the catalytic material. The second material can be less catalytic with respect to the removal agent than the catalytic material. The second material can be non-catalytic. The second material comprise silicon. In some instances, the second material can be a silicon oxide.

The first area and the second area can be arranged as any suitable pattern. For example, the first area and the second area can be alternating lines, one area can surround the other area in plan view, et cetera. The patterned structure can be provided on any suitable substrate. The substrate can be a semiconductor substrate, such as a silicon substrate. The term substrate may refer to any underlying material or materials that may be used to form, or upon which, a device, a circuit, material or a material layer may be formed. A substrate can include a bulk material, such as silicon (such as single-crystal silicon), other Group IV materials, such as germanium, or other semiconductor materials, such as a Group II-VI or Group III-V semiconductor materials. A substrate can include one or more layers overlying the bulk material. The substrate can include various features, such as gaps, including recesses, lines, trenches or spaces between elevated portions, such as fins, and the like formed within or on at least a portion of a layer of the substrate. Substrate may include nitrides, for example TiN, oxides, insulating materials, dielectric materials, conductive materials, metals, such as such as tungsten, ruthenium, molybdenum, cobalt, aluminum or copper, or metallic materials, crystalline materials, epitaxial, heteroepitaxial, and/or single crystal materials. In some embodiments of the current disclosure, the substrate comprises silicon. In some embodiments, substrate comprises, consists essentially of, or consists of glass. The substrate may comprise other materials, as described above, in addition to silicon. The other materials may form layers. A substrate may be patterned. Patterned substrates may comprise substrates that may include semiconductor device structures formed into or onto a surface of the substrate, for example, a patterned substrate may comprise partially fabricated semiconductor device structures, such as, for example, transistors and/or memory elements.

A carbon-containing film, such as an organic film is over the patterned structure. The carbon-containing film can be formed by blanket deposition over the patterned structure. The carbon-containing, such as organic, film can be formed by partially selective deposition over the patterned structure. The carbon-containing, such as organic, film can be formed by any suitable process, such as molecular layer deposition (MLD), chemical vapor deposition (CVD), spin coating, dip coating, evaporation, sputtering, filtered cathodic arc deposition method etc. The carbon-containing film forms over both first area and the second area. In some embodiments, the carbon-containing, such as organic, film is continuous and covers both the first and second areas. The carbon-containing, such as organic, film can be a blanket layer with a relatively uniform thickness over the first and second areas in some such embodiments. In embodiments, in which carbon-containing material covers the first area and the second area substantially completely, there may be areas on the first area and/or second area that are not covered by carbon-containing material, but the non-covered areas do not prevent the performance of a method according to the current disclosure.

The carbon-containing film can include any suitable material through which the removal agent can diffuse to be activated by the underlying removal-enhancing, such as catalytic material to remove material of the carbon-containing film. In some embodiments, the carbon-containing film is an organic film and comprises a polymer. In some embodiments, the polymer deposited is a polyimide. In some embodiments, the polymer deposited is poly(methyl methacrylate) (PMMA). Other polymers can be deposited over the patterned structure. Other examples of deposited polymers include polyamide, polyurea, polyurethanes, polythioureas, polyesters, polyimines, other polymeric forms or mixtures of the above materials. In one example, polyamide can be vapor deposited by methods described in U.S. Pat. No. 10,343,186, issued Jul. 9, 2019, the entire disclosure of which is incorporated herein by reference for all purposes. For example, DAH and PMDA can be alternately exposed to the substrate at about 170° C. In some embodiments, the carbon-containing film is an elemental carbon-containing film. For example, an elemental carbon-containing film may comprise at least 60 at. %, at least 80 at. %, at least 90 at. %, at least 95 at. % or at least 99 at. % carbon. A carbon-containing film may comprise elemental carbon. A carbon-containing film may consist essentially of, or consist of elemental carbon. A carbon-containing film may comprise amorphous carbon. A carbon-containing film may consist essentially of, or consist of amorphous carbon. A carbon-containing film may comprise graphite or graphite-like carbon. A carbon-containing film may consist essentially of, or consist of graphite or graphite-like carbon. A carbon-containing film may comprise diamond like carbon. A carbon-containing film may consist essentially of, or consist of diamond like carbon. Without limiting the current disclosure to any specific theory, elemental carbon by may lack functional groups and can therefore serve as a good passivating layer for the area selective deposition. In some embodiments, elemental carbon-containing material may be doped by another element, for example to influence its reactivity or to introduce dopants into target layers. Thus, various carbon-containing materials, including elemental carbon-containing materials may be used in the methods according to the current disclosure.

In some embodiments, the carbon-containing film is an organic film and comprises a precursor material to a polymer film that can be converted or polymerized by a treatment process. For example, the as deposited organic film can comprise a polyamic acid. In some embodiments, the polyamic acid is converted to a polyimide. Polyamic acid is a common polyimide precursor that can be cyclized, or imidized, to form polyimide. Polyamic acid can be converted to polyimide in a variety of techniques, including annealing, plasma (e.g., using an inert or rare gas), chemical treatment (e.g., using an anhydride), UV treatment, and other post-deposition treatments.

The carbon-containing film, such as an organic film, comprises a material and has a thickness suitable to allow the removal agent to diffuse through the carbon-containing, such as organic, film to the patterned structure. A carbon-containing film with any thickness relevant to microelectronics manufacturing processing can be suitable for the removal agent to diffuse through the carbon-containing film to the patterned structure. Removal may take longer for thicker carbon-containing layers. A carbon-containing film, such as an organic film, can have a thickness, for example, in a range from about several nanometers to about 10 micrometers. For example, the carbon-containing, such as organic, film can have a thickness in a range from about 0.5 nm to about 1000 nm, from about 1 nm to about 500 nm, from about 2 nm to about 300 nm, from about 2.5 nm to about 200 nm, from about 3 nm to about 100 nm, or from about 5 nm to about 50 nm. In some embodiments the thickness may be less than about 500 nm, less than about 250 nm, less than about 100 nm, less than about 50 nm, less than about 25 nm, less than about 15 nm, less than about 10 nm, less than about 7 nm, less than about 5 nm, less than about 3 nm, or less than about 2 nm, while in other embodiments the thickness can be more than about 50 nm, more than about 100 nm, more than about 200 nm, more than about 500 nm, more than about 750 nm, or more than about 1000 nm. In some instances, the carbon-containing, such as organic films could be more than 2 μm, more than 5 μm, more than 7.5 μm, or more than 10 μm thick. The carbon-containing, such as organic film can be, for example, PMMA or polyimide. In experiments, $O_2$ diffusion through polymers with a thickness in a range from about 40 nm to about 130 nm has worked well for selectively removing polymer material. Of course, the skilled artisan will appreciate that the thicknesses that allow diffusion and catalytic activation will depend upon the selected removal agent, density and degree of cross-linking in the carbon-containing, such as organic film, temperatures and pressures of the selectively removal operation, etc.

In some embodiments, the carbon-containing, such as organic film is exposed to a removal agent to selectively remove material of the organic film at block 106. In some embodiments, the carbon-containing, such as organic film is exposed to the removal agent in a different reaction space as the carbon-containing film is deposited on the patterned structure. In some other applications, the carbon-containing film is exposed to the removal agent in the same reaction space as the carbon-containing film is deposited on the patterned structure.

The reactant can be a vapor phase reactant. The reactant can be $O_2$. The reactant can be another suitable oxygen source that can diffuse through the polymer layer and be activated by the catalytic material. Examples of other oxygen sources that are insufficiently reactive without catalyzing and can be used for selective organic material removal include $N_2O$ and $H_2O$. In some embodiments, the reactant may comprise oxygen but not metals. The reactant can be $H_2$. The reactant can be another suitable hydrogen source that can be activated by catalytic material. In some embodiments, the reactant may comprise hydrogen but not metal, or the reactant can comprise hydrogen and oxygen but not metals. However, in some embodiments, the reactant may comprise hydrogen and semi-metal, such as As, but not Si or Ge, or the reactant can comprise hydrogen and non-metal, such as P. The reactant can be hydrogen peroxide ($H_2O_2$). The reactant can be hydrazine ($N_2H_4$), or a derivative thereof. For example, the reactant can comprise $NH_3$, $NR_{3-x}H_x$, $PH_3$, or $AsH_3$.

Exposing the carbon-containing, such as organic, film to the removal agent may cause the removal agent to diffuse through the carbon-containing film to the patterned structure. The different areas of chemically different compositions of the patterned structure react differently with the removal agent. For example, one area of the patterned structure can catalytically activate the removal agent to cause material of the carbon-containing, such as organic, layer to be removed at a greater rate than material over another area of the patterned structure. Thus, block 106 can be conducted for a duration that causes all of the material of the carbon-containing, such as organic, film to be removed over the one area while leaving some carbon-containing material over the other area, in some embodiments a continuous layer covering the other area, to thereby provide selective removal of the material of the carbon-containing layer. More details regarding specific examples of exposing a carbon-containing film to a reactant for selective removal are provided herein.

Selectivity for removal can be given as a percentage calculated by [(removal over a first area)-(removal over second area)]/(removal over the first area). Thus, if material is not removed from the second area, the removal would be 100% selective. If the removal over the second area is 20% of the removal over the first area, the removal would be 80% selective. Removal can be measured in any of a variety of ways. In some embodiments, removal may be given as the measured thickness of the material removed. In some embodiments, removal may be given as the measured amount of material removed. In some embodiments, removal can be given as a rate in thickness removal over time (e.g., nm/min, Å/second, etc.).

The removal rates of carbon-containing material, such as polymer material can depend on a variety of parameters, such as one or more of catalytic material, type of structure, such as polymer type, and thickness, heating temperature and atmosphere, as well as annealing temperature, and annealing atmosphere. In some embodiments, under ambient atmosphere, platinum is an efficient catalyst. As one example, at 250° C., after 4 hours of annealing, 115 nm of polyimide can be almost completely removed with a removal rate of 0.62 nm/min while the removal rate of polyimide on native $SiO_2$ is about 11 times lower than on platinum. As another example, at 300° C., within 10 minutes around 100 nm of polyimide was almost completely removed with the removal rate of polyimide on platinum about 8.5 nm/min and the removal rate of polyimide on native $SiO_2$ being about 15 times lower. As one more example, at 200° C. for PMMA, the removal rate on platinum is about 9.6 nm/min, 36 times larger than on native $SiO_2$.

A rate of removal of material of a carbon-containing film, such as an organic film over the first area being at least 2 times the rate of removal of the material of the carbon-containing film from over the second area is generally desirable. The rate of removal of material of a carbon-containing, such as organic, film over the first area can be at a rate in a range from about 1.25 to about 100, from about 1.5 to about 50, from about 2 to about 36 or from about 3 to about 25 times the rate of removal of the material of the carbon-containing film from over the second area. In some other embodiments, the rate of removal of material of a carbon-containing film over the first area can be at a rate in a range from about 1.25 times higher or more, from about 1.5 times higher or more, from about 2 times higher or more, from about 3 times higher or more, from about 5 times higher or more, from about 10 times higher or more, from about 25 times higher or more, or from about 50 higher or more than the rate of removal of the material of the carbon-containing film from over the second area. The relative of rates of removal can be sufficiently high that material remains on the second area while being completely removed from the first area. Faster removals can have higher ratios.

Exposing the carbon-containing such as organic, film to the removal agent can cause a thermal removal reaction. The thermal removal reaction can include annealing. Annealing temperatures that are too low can impede and/or prevent selective removal of material of the carbon-containing, such as organic, film, while excessive temperature can cause too fast removal even over the second area without catalytic material. A sufficiently high annealing temperature can provide advantageous selective removal of carbon-containing material over catalytic material of the patterned structure. The thermal removal reaction can be at a substrate temperature equal to or over about 200° Celsius and equal to or less than about 500° Celsius, and particularly between about 200° C. and 300° C. The upper limit of the annealing temperature can be based on a maximum temperature that is tolerable for polymer removal over an area of non-catalytic or less catalytic material. Under ambient atmosphere, for PMMA, the annealing temperature can be in a range from about 200° C. to about 250° C. Under ambient atmosphere, for polyimide, the annealing temperature can be in a range from about 250° C. to about 300° C. A higher annealing temperature within the above temperature ranges may be preferred in some embodiments.

Figure 1B:
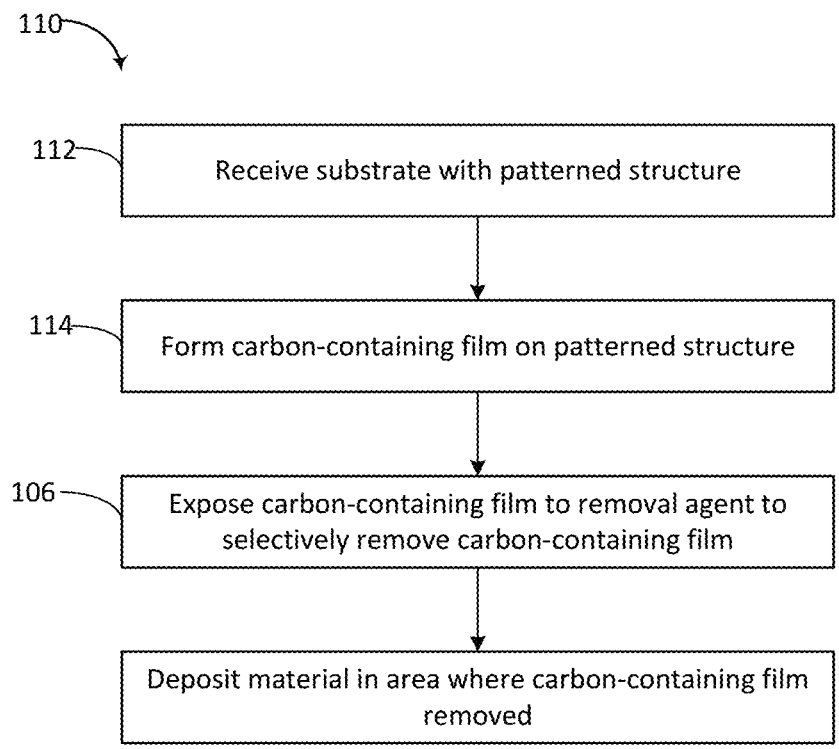
FIG. 1B is a process flow diagram for a method that includes forming a patterned organic film with selective removal of organic material and subsequent deposition according to an embodiment.

FIG. 1B is a process flow diagram for a method 110 that includes forming a patterned carbon-containing film, such as an organic film, with selective removal of carbon-containing, such as organic, material according to an embodiment. In certain applications, the method 110 can be part of a semiconductor manufacturing process. The method 110 can be performed in one or more reaction spaces. At least a portion of the method 110 can be performed using the system of FIG. 4, for example. In particular, the selective removal of carbon-containing material, such as organic material, can be performed using the system of FIG. 4. According to certain applications, the selective removal of carbon-containing material, such as organic material, can be performed in a reaction space and one or more other operations can be performed in one or more other reaction spaces. The method 110 can include additional operations. Some or all of the operations of the method 110 can be repeated but need not be performed in the illustrated sequence nor the same sequence in each repetition if repeated. The method 110 can be readily extended to more complex processes.

A substrate with a patterned structure thereon is received at block 112. Examples of the patterned structure are shown in FIGS. 2A and 3A. The patterned structure can include any suitable features of the patterned structures disclosed herein.

At block 114, a carbon-containing, such as organic, film is formed over the patterned structure. The carbon-containing, such as organic, film can be any of the carbon-containing films disclosed herein. The carbon-containing film can be formed by any suitable technique disclosed herein. After block 114, the structure provided at block 102 of FIG. 1A can be formed.

The carbon-containing, such as organic, film is exposed to a removal agent to selectively remove material of the carbon-containing film at block 106.

In some applications, a desired carbon-containing, such as organic, layer can be too thick for the removal agent to diffuse through. In such applications, forming a carbon-containing, such as organic, layer and exposing the carbon-containing layer to the removal agent for selective removal can be alternatingly and sequentially performed to form the desired carbon-containing layer. The cyclical process allows forming thinner blanket layers that allow diffusion of the removal layer to reach the catalytic material of the underlying pattern in each cycle, while repeating the cycle allows the thickness of the carbon-containing, such as organic, material to build up on the non-catalytic material of the pattern.

At block 118, material can be deposited over an area where the carbon-containing, such as organic, film was removed at block 106. The selective removal at block 106 can leave a surface of the patterned structure exposed. The subsequently deposited material can be deposited over the exposed surface of the patterned structure. The deposition at block 118 can be selective deposition that occurs over the exposed surface of the patterned structure and does not significantly occur over the carbon-containing, such as organic, film. To the extent the deposition is imperfectly selective, a clean up isotropic etch can remove any material over the carbon-containing passivation layer in the second area while leaving some of the deposited material in the first area over the catalytic material, or removal of the sacrificial passivation material can undercut and remove any undesired deposition in the second area. The deposition at block 118 can be a metallic deposition.

The metallic deposition process can involve pulsing a reactant, such as $O_2$, before and/or after precursor exposure, in which pulsing the reactant causes catalytic removal of carbon-containing, such as organic, material on the metallic material. Accordingly, selective carbon-containing, such as organic, film removal and deposition can be combined in a single chamber and process, and can be alternated or otherwise cycled to selectively remove carbon-containing, such as organic, film in the first area and selectively deposit metal in the first area without any additional patterning step. The selective deposition can be for a metallic material, such as elemental metal selective deposition or metal compound deposition by vapor phase deposition, such as by alternating exposure to two or more deposition reactants that are relatively inert over the carbon-containing, such as organic, passivation layer. In other embodiments, the selective deposition over the first area relative to the carbon-containing, such as organic, film remaining over the second area can apply liquid precursors to the substrate.

FIGS. 2A to 2D are cross sections of example structures on a substrate corresponding to method operations of FIGS. 1A and/or 1B.

FIG. 2A is a cross sectional diagram illustrating a patterned structure 202. The patterned structure 202 can be directly over a substrate. Alternatively, there can be one or more intervening layers between the substrate and the patterned structure 202. The substrate can be a semiconductor substrate. The patterned structure 202 includes a first area 204 and a second area 206.

In the first area 204, the patterned structure 202 comprises a catalytic material. The catalytic material can be any suitable material capable of activating the removal agent provided at block 106 of the method 100. The catalytic material can be a material that is present from a previous processing operation. The catalytic material can be any suitable catalytic material disclosed herein, such as any of the catalytic materials discussed with reference to FIG. 1A. In some instances, a catalytic material can be added to a non-catalytically active material present from a previous processing operation. For example, a noble metal can be deposited onto a copper surface. Such deposition can be performed by electrodeposition, electroless deposition, or by a galvanic displacement reaction. These deposition methods are by their nature highly selective and can avoid depositing on the second area 206 of the patterned structure 202, such as inorganic dielectric (e.g., $SiO_2$) or semiconductor (e.g., Si).

Example recipes for providing catalytic surfaces include: Pt prepared by EBE with thicknesses ranging from about 40 nm to about 70 nm; Ru formed by 1000 cycles of ALD at 400° C. with each cycle including 0.5 second $Ru(Cp)_2$ exposure then a 0.5 second $N_2$ purge the a 0.2 second air exposure then a 0.5 second $N_2$ purge, where Ru thickness is around 50 nm; and $CeO_2$ formed by 1500 cycles of ALD at at 250° C. where each cycle includes 1 second $Ce(thd)_4$ exposure then a 1.5 second $N_2$ purge then a 2.5 second $O_3$ exposure then a 1.5 second $N_2$ purge, where the $CeO_2$ thickness was about 39 nm. The skilled artisan will appreciate that conditions and thicknesses can be varied from the foregoing examples.

In the second area 206, the patterned structure 202 comprises a second material that is chemically different than the catalytic material of the first area 204. The second material can be non-catalytic or less catalytic than the catalytic material for the removal agent provided at block 106 of the method 100. The second material can comprise silicon. In some instances, the second material can comprise a silicon oxide. Experiments described herein were performed to compare reactions on native oxide over silicon in the second area 206 with reactions on catalytic materials such as Pt, Ru or $CeO_2$ in the first area 204.

Figure 2B:
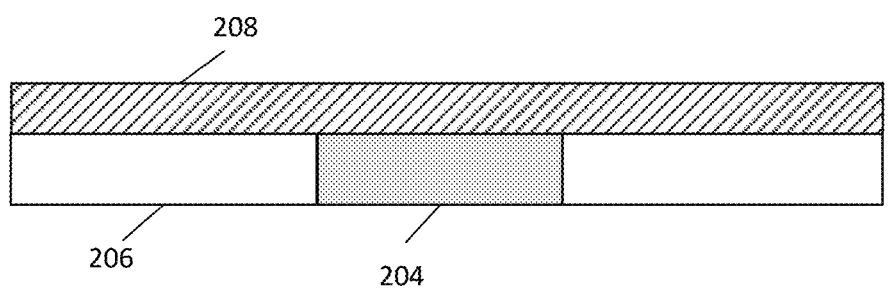
FIG. 2B is a schematic cross sectional diagram illustrating an organic film over the patterned structure of FIG. 2A.

FIG. 2B is a cross sectional diagram illustrating a carbon-containing, such as organic, film 208 over the patterned structure. The organic film 208 can be formed at block 114 of the method 110. The FIG. 2B shows an example of a carbon-containing, such as organic, film over a patterned structure that can be provided in a reaction space before selective removal of carbon-containing, such as organic, material. The carbon-containing film, such as organic film, can have any suitable thickness through which the removal agent provided at block 106 of the method 100 can diffuse to reach a catalytic surface in the first area 204 of the patterned structure. The carbon-containing, such as organic, film can be any suitable carbon-containing film disclosed herein, such as any of the organic films discussed with reference to FIG. 1A.

Figure 2C:
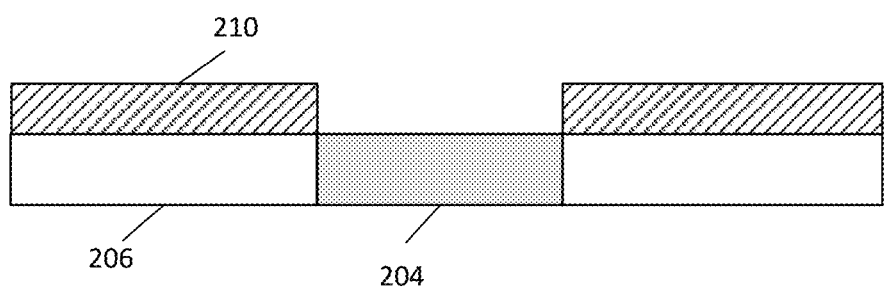
FIG. 2C is a schematic cross sectional diagram illustrating a patterned organic film over the patterned structure after selective removal of material of the organic layer.

FIG. 2C is a cross sectional diagram illustrating a patterned carbon-containing, such as organic, film 210 over the patterned structure after selective removal of material of the carbon-containing layer. The carbon-containing, such as organic, film 208 can be exposed to a reactant that is catalytically activated by the catalytic material of the first area 204 of the patterned structure. This can form the patterned carbon-containing film 210 shown in FIG. 2C from the carbon-containing film 208 shown in FIG. 2B. As illustrated in FIG. 2C, material of the carbon-containing film is completely removed over the first area 204 leaving a surface of the patterned structure exposed in the first area 204. In some embodiments, the patterned carbon-containing, such as organic, film 210 can have substantially the same thickness over the second area as prior to selective removal of carbon-containing material. In some embodiments, some of the carbon-containing material of the carbon-containing film 208 of FIG. 2B can be removed during the selective removal of carbon-containing material such that the thickness of the patterned carbon-containing film 210 over the second area 206 in FIG. 2C is less than the thickness of the carbon-containing film 208 of FIG. 2B prior to selective removal.

Figure 2D:
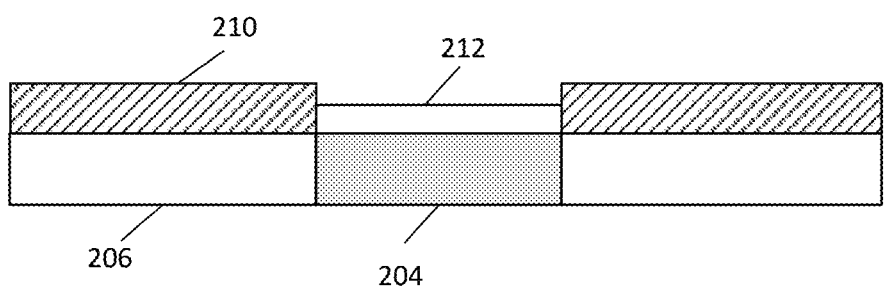
FIG. 2D is a schematic cross sectional diagram illustrating material formed over an exposed portion of the patterned structure after selective removal of material of the organic layer.

FIG. 2D is a cross sectional diagram illustrating material 212 selectively formed over the exposed first area 204 of the patterned structure after selective removal of material of the carbon-containing, such as organic, layer, relative to the carbon-containing material 210 remaining over the second area 206. The selectively formed material 212 can be formed at block 118 of the method 110. The material 212 can include a metal. As one example, the material 212 can comprise iridium. The material 212 can be compound that contains metal, such as a metal oxide, a metal nitride, a metal carbide, etc. The material 212 can be a material other than metal. In certain embodiments, the material 212 can be deposited in the same reaction chamber as where the selective removal of the carbon-containing, such as organic, material occurs. Alternatively, different reaction chambers can be used for selective removal of carbon-containing material and subsequent metallic deposition.

Figure 3B:
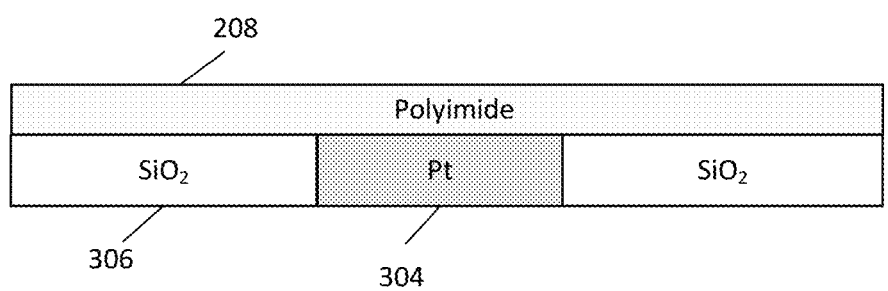
FIG. 3B is a schematic cross sectional diagram illustrating a polymer film over the patterned structure of FIG. 3A.
Figure 3C:
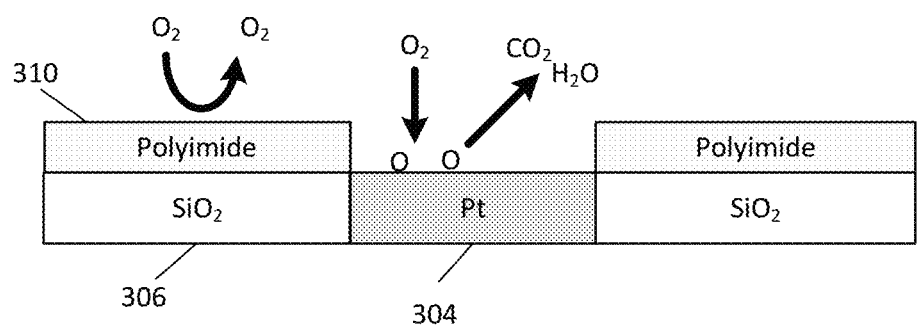
FIG. 3C is a schematic cross sectional diagram illustrating a patterned polymer film over the patterned structure after selective removal of material of the polymer film.

FIGS. 3A to 3C are cross sections corresponding to method operations of FIGS. 1A and/or 1B for an example patterned structure, polymer film, and removal agent. In this example, the patterned structure comprises a patterned structure of platinum and silicon dioxide, a polyimide film, and $O_2$ as a removal agent.

FIG. 3A is a cross sectional diagram illustrating a patterned structure 302. The illustrated patterned structure includes platinum in a first area 304 and silicon dioxide in a second area 306.

FIG. 3B is a cross sectional diagram illustrating a polyimide film 308 over the patterned structure. The polyimide film 308 can be formed, for example, by a molecular layer deposition (MLD) on a native oxygen terminated patterned structure 302, for example.

In the selective removal of carbon-containing, such as organic, material, $O_2$ is provided as the removal agent. The $O_2$ diffuses through the polyimide film 308 of FIG. 3C. At the catalytic surface in first area 304, the $O_2$ molecules are activated by dissociating into atomic oxygen under the reaction space conditions (e.g., substrate temperature in block 106). The atomic oxygen reacts with the polyimide film 308 to remove material of the polyimide film 308 into small molecules, such as water and carbon oxides. This selectively removes material of the polyimide film 308 over the first area 304 of the patterned structure at a greater rate than over the second area 306. The selective removal can involve a relatively high temperature annealing under ambient atmosphere.

FIG. 3C is a cross sectional diagram illustrating a patterned polyimide film 310 over the patterned structure after selective removal of material of the polyimide film. As illustrated, polyimide material is removed over the first area 304 of the patterned structure. A slight decrease in thickness of the polyimide material over the second area 306 can result from selective removal. This slight decrease could be due to densification, to a lower rate of combustion of non-activated $O_2$, and/or from diffusion of atomic oxygen from the first areas 304 to the second areas 306.

After material of the polymer film is selectively removed, a selective deposition of metallic material can be performed. The metallic material can comprise a noble metal. The metallic material can be selectively deposited by ALD. The metallic material can be deposited by any other suitable process.

The metallic deposition can also involve catalytic disassociation of a reactant, such as $O_2$ on the metallic surface. With a properly chosen relatively low temperature, the process can be robust with a desirable selectively achieved. Known $O_2$ based metallic deposition processes can be applied. As one example, Ir can be selectively deposited on Pt by ALD using Ir(acac)$_3$ and $O_2$ as precursors at 225° C. With the selective removal of carbon-containing, such as organic, material and subsequent metallic deposition, dielectric-on-dielectric and metal-on-metal deposition can be achieved without any additional patterning step.

Although FIGS. 3A-3C relate to $O_2$ as a reactant for catalytic activation, other removal agents can be used in accordance with the principles and advantages disclosed herein. For example, $H_2$ can be used as a removal agent for catalytic activation. In this example, $H_2$ can diffuse through an organic film and to dissociate to atomic hydrogen for hydrogenolysis to break down the material of the carbon-containing, such as organic, film into smaller fragments that desorb from underlying catalytic material.

Figure 4:
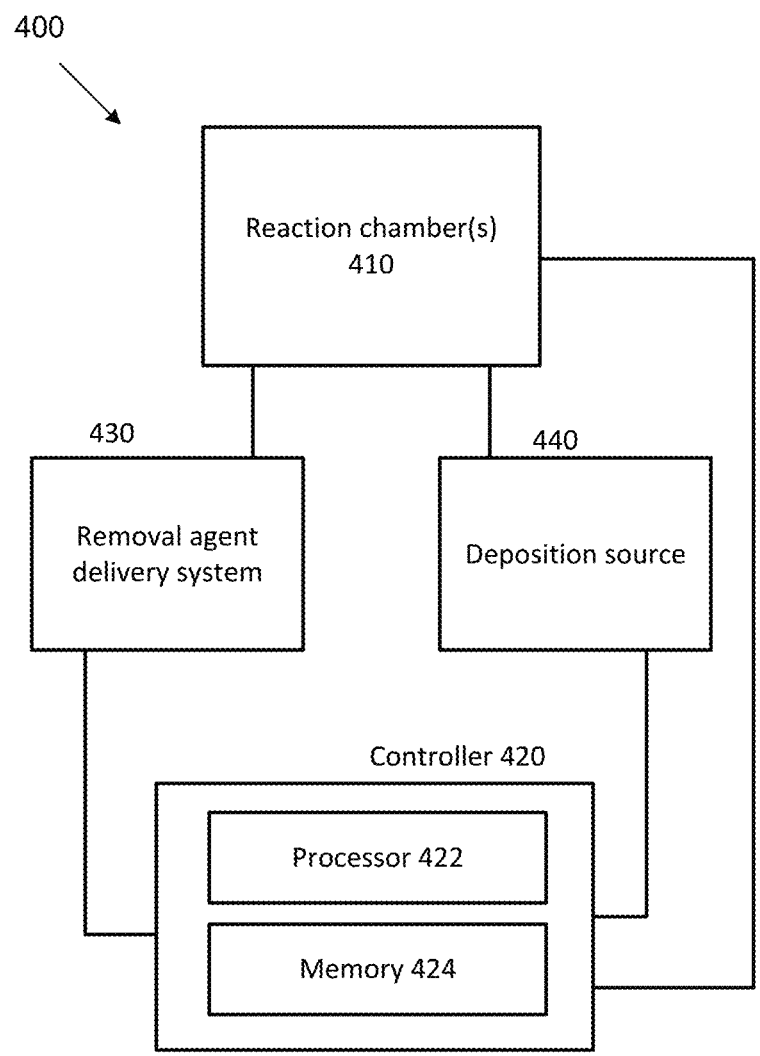
FIG. 4 is a schematic block diagram illustrating a system arranged to perform the methods according to embodiments disclosed herein.

FIG. 4 is a schematic block diagram illustrating a system 400 arranged to perform at least selective removal of carbon-containing, such as organic, material of the methods disclosed herein. The system 400 is an illustrative example of an apparatus that can perform at least selective removal of carbon-containing material of the methods disclosed herein. The system 400 is an apparatus for forming a carbon-containing, such as organic, film by selective removal of carbon-containing, such as organic, material. The system 400 can also perform other functions, such as forming the carbon-containing film prior to selective removal of carbon-containing material and/or depositing a metallic material after selective removal of carbon-containing material. The system 400 can be a reactor. As illustrated, the system 400 includes reaction chamber(s) 410, a controller 420, a removal agent delivery system 430, and a deposition source 440. The system 400 can include more elements than illustrated, such as robotics, heating and pressure control systems, etc., and/or a subset of the illustrated elements in certain instances.

Each reaction chamber 410 defines a reaction space. The reaction chamber 410 can hold one or more substrates and provide an environment for processing disclosed herein. The system 400 can be a cluster tool with different reaction chambers 410 for performing selective carbon-containing, such as organic, material removal and deposition. Alternatively, separate systems can be used to perform each operation and/or sub-grouping of operations of the methods disclosed herein.

In order to conduct the processes described above, the system 400 includes a controller 420 configured to cause the system to perform operations of the process. The controller 420 can be referred to as a control system. As used herein, "configured to" refers to being arranged to perform a function instead of being merely capable of performing a function. For example, the controller 420 is programmed to cause the system 400 to perform operations of the methods disclosed herein. The controller 420 can comprise a processor 422 and a memory 424. The controller 420 can include specific instructions stored in the memory 424 that, when executed by the processor 422, cause some or all of the operations of the methods disclosed here to be performed. The controller 420 can include any suitable components known in the industry for controlling processing operations disclosed herein. A general purpose computer can be programmed for use as the controller 420 in certain applications.

The controller 420 can be configured to control the supply of reactant to the deposition chamber 410 via a removal agent delivery system 430 connected to the deposition chamber 410. For example, the controller 420 can cause valves of the removal agent delivery system 430 to open and/or close to cause the reactants to be provided to the reaction space 410 according to the specific instructions stored in the memory 424. Thus, the controller 420 can provide the reactant for selective removal of material of a carbon-containing film, such as organic film.

The controller 420 can be configured to control the supply of deposition material to a deposition chamber of the reaction space(s) 410 via a deposition source 440 connected to the deposition chamber 410. The deposition chamber can be the same chamber as the selective removal chamber or can be a different chamber in a cluster tool. For example, the controller 420 can cause a valve to open and/or close to cause the deposition reactants to be provided to the reaction space 410 according to the specific instructions stored in the memory 424. Thus, the controller 420 can provide the reactants for deposition after selective removal of material of a carbon-containing, such as organic, film. The deposition source 440 can provide a precursor for metallic deposition, such as any of the metallic deposition discussed herein. The selective carbon-containing material removal and the metallic deposition can both be performed in the same reaction space 410 or can be conducted in separate reactions chambers. In one embodiment, the controller 420 can control the system 400 to cycle between exposing to removal agent and deposition reactants.

The controller 420 can be configured to control other operations of the system 400, such as temperature, pressure, and robotic control, among other operational parameters. The controller can control one or more of these parameters during any operations of the methods disclosed herein. For example, the controller 420 can be programmed to control temperature for annealing substrate(s) in the presence of the removal agent to selectively remove carbon-containing, such as organic, material.

Tests related to the selective polymer removal disclosed herein have been performed. Selective removal tests were performed on two separate substrates. A first substrate included 1.5 nanometer (nm) thick native silicon dioxide on silicon. A second substrate included a 60 nm thick platinum layer over a 15 nm thick titanium layer on silicon. A polyimide film of 90 nm was blanket deposited on each substrate by MLD. The polyimide film was exposed to $O_2$.

The polyimide films on the native silicon dioxide and the platinum surfaces were annealed in an oven under ambient atmosphere at different temperatures from 170° C. to 300° C. For a catalysis of oxygen for selective removal, oxygen can be supplied for the anneal from ambient air, a separate source of oxygen compound such as NO or $NO_2$, a separate diatomic oxygen ($O_2$) source, or a combination of the above. Experimental results indicate that selective removal of polymer material, such as polyimide, by catalytically activating a reaction agent over certain areas of a pattern structure can be achieved. For example, desirable selectivity of polyimide over a patterned structure of platinum and silicon dioxide was achieved at annealing temperatures of about 250° C. and about 300° C.

In the experimental results from annealing temperatures from 170° C. to 300° C., no thickness decrease for polyimide was observed for both substrates for annealing temperatures of 170° C. and 200° C. For an annealing temperature of 250° C., polyimide on platinum was selectively removed. At 250° C., 120 nm of polyimide can be completely removed from platinum in 4 hours of annealing. Further increasing annealing temperature to 300° C., the removal speed is significantly faster. At 300° C., 85 nm of polyimide can be completely removed from 10 minutes of annealing. At 300° C., polyimide on silicon has been observed to start slowly being removed.

Higher annealing temperatures can achieve faster removal of polymer material for polymers, such as polyimide, over a catalytic surface. For example, at an annealing temperature of 300° C., removal speed of polyimide over platinum was significantly faster than at an annealing temperature of 250° C. At too high of a temperature, such as over 600° C., carbon-containing, such as organic, material over even non-catalytic material, such as silicon dioxide, can be removed at a high enough rate that that the process cannot be reliably controlled to ensure some of the carbon-containing material remains over the second area.

At a minimum annealing temperature, a catalytic material, such as platinum, can be activated to dissociate $O_2$ to more reactive atomic oxygen to remove polymer material, such as polyimide. For example, an annealing temperature somewhere between about 200° C. and about 250° C., should be the point where platinum starts to catalytically dissociate $O_2$ to more reactive atomic oxygen to remove polyimide. Thus, an annealing temperature of greater than 225° C. can have advantages relative to 200° C. in some embodiments, and an annealing temperature of greater than 250° C. can have advantages relative to 200° C. and/or 225° C., for polyimide, air/$O_2$ and Pt catalytic material in some embodiments. The oxygen atoms can react with polyimide to form volatile species, such as $CO_2$ and $H_2O$, thereby resulting in selective removal of polyimide on platinum versus silicon dioxide.

Selective polymer material removal can be incorporated into a polymer deposition process where the deposition temperature is sufficiently high to catalytically activate $O_2$ or another suitable removal agent to remove material of the polymer film. For example, an MLD process with a deposition temperature of above 200° C. could selectively remove polymer material over platinum during $O_2$ exposure.

Alternatively, the polymer removal reaction temperature can be reduced by using a different catalyst such that the removal reaction temperature is suitable for an MLD process for depositing the polymer.

Selectivity similar to the separate substrate test example was also demonstrated on patterned platinum/silicon dioxide surfaces. For example, selectivity was demonstrated for polyimide over a patterned $Pt/SiO_2$ structure with dot shaped platinum areas. After annealing at 300° C. for 30 minutes, polyimide was removed over platinum and remained over silicon dioxide.

Similar tests for selectively removing polyimide were performed with $CeO_2$ and ruthenium as catalytic materials. The tests indicate that the catalytic power for a polyimide removal reaction increases in the following order: $CeO_2$<Ru<Pt.

Annealing tests were also performed for substrates with PMMA over catalytic material on a silicon substrate and PMMA over reference silicon. These tests indicate that at about 300° C. PMMA on the reference silicon starts to substantially combust. Thus, a temperature of less than 300° C. or less than 275° C. can have advantages for PMMA, air/$O_2$ as a removal agent, and catalytic material that is selected from the group consisting of Pt, Ru, and $CeO_2$. PMMA was easier to remove than polyimide in the tests. As with the polyimide tests, these tests indicate that the catalytic power for a PMMA removal reaction increases in the following order: $CeO_2$<Ru<Pt.

The methods disclosed herein demonstrate an efficient way for selectively removing polymer on a catalytic surface. An annealing temperature in a range from about 200° C. to 250° C. should sufficient for catalytic removal in certain embodiments. The annealing temperature can depend on removal agent, catalytic material, polymer material, polymer thickness, or any suitable combination thereof. For variety of conditions, an annealing temperature can be in one of the following ranges: from about 200° C. to 300° C., from about 225° C. to about 275° C., or from about 240° C. to about 270° C.

FIG. 5A is a process flow diagram of an embodiment of a method 50 according to the current disclosure. The method 50 can be part of a semiconductor device manufacturing process. The method 50 can be performed in one or more reaction spaces, such as heating stations. The method 50 can be performed using the system of FIG. 7, for example. The method 50 can include additional operations not depicted in FIG. 5, and the method 50 can be extended to more complex processes.

At block 51, a substrate comprising a first area and a second area, wherein the first area and the second area are covered with carbon-containing, such as organic, material, is provided into a heating station. The carbon-containing material may be any material described in the current disclosure. For example, the carbon-containing material may be organic material, such as PMMA spin-coated over a substrate having a first area comprising reduced copper, and a second area comprising silicon oxide. The carbon-containing material may be PMMA spin-coated over a substrate having a first area comprising copper oxide, and a second area comprising silicon oxide. The thickness of the carbon-containing layer may be, for example, about 120 nm or about 210 nm before heating.

At block 52, the substrate is heated in the reaction space to remove carbon-containing material from the first area. The heating may take place, for example, for 30 minutes at 300° C. The rate of carbon-containing material removal on the second area comprising silicon oxide may be, for example, between 0.2 nm $min^{-1}$ and 1 nm $min^{-1}$. The rate of carbon-containing material removal on the first area comprising copper oxide, may be for example about 3 nm $min^{-1}$, about 3.5 nm $min^{-1}$, about 4 nm $min^{-1}$ or about 5 nm $min^{-1}$. The rate of carbon-containing material removal on the first area comprising reduced copper, may be for example about 1.5 nm $min^{-1}$, about 2 nm $min^{-1}$, or about 2.5 nm $min^{-1}$ or about 3 nm $min^{-1}$. The rate or removal, measured a decrease in carbon-containing layer thickness, may vary at different stages of heating. In some embodiment, the rate of removal may decrease during heating.

Heating at block 52 may take place in various temperatures, which may influence the rate of removal of the carbon-containing material. For example, carbon-containing material may be removed from a first area comprising ruthenium at a rate of 0.6 nm $min^{-1}$ at a temperature of 350° C., but the rate of removal may be about 4 nm $min^{-1}$ at 400° C. or above. As another example, carbon-containing material may be removed from a first area comprising copper at a rate of 0.4 nm $min^{-1}$ at a temperature of 350° C., but the rate of removal may be about 3.5 nm $min^{-1}$ at 400° C. or above. As a further example, carbon-containing material may be removed from a first area comprising platinum at a rate of 2 nm $min^{-1}$ at temperatures below 400° C., but the rate of removal may be about 4 nm $min^{-1}$ at 450° C. In all these examples, the rate of removal on a second area comprising silicon oxide, is at least one 1 nm $min^{-1}$, for example, 2.5 nm $min^{-1}$, lower.

FIG. 5B depicts a similar process to that presented in FIG. 5A, but in the embodiment of FIG. 5B, the method comprises block 53 of forming carbon-containing material over a substrate comprising a first area and a second area prior to heat treatment. Block 53 may be performed as described in the current disclosure.

FIG. 5C depicts a similar process to that presented in FIG. 5A, but in the embodiment of FIG. 5C, the method comprises block 54 of depositing target material on the first area after removing carbon-containing material from the first area through heat treatment. Block 54 may be performed as described in the current disclosure FIG. 6, panels A to D, depicts schematic cross sections of embodiments of a substrate 60 processed according to a method of the current disclosure. Panel A exemplifies a substrate 60 comprising a first area 61 and a second area 62. The first area 61 comprises a removal-enhancing material according to the current disclosure. The removal-enhancing material may be any suitable material capable of enhancing the removal of carbon-containing material 64. The removal-enhancing material can be a material that is present from a previous processing operation. In some embodiments, a removal-enhancing material can be added to another material present from a previous processing operation. Adding of a removal-enhancing material may be performed by electrodeposition, electroless deposition, or by a galvanic displacement reaction, for example. The addition of a removal-enhancing material may be selective. Thus, the first area and the second area may be defined by the selective addition of removal-enhancing material to pre-determined areas of a substrate.

Figure 6:
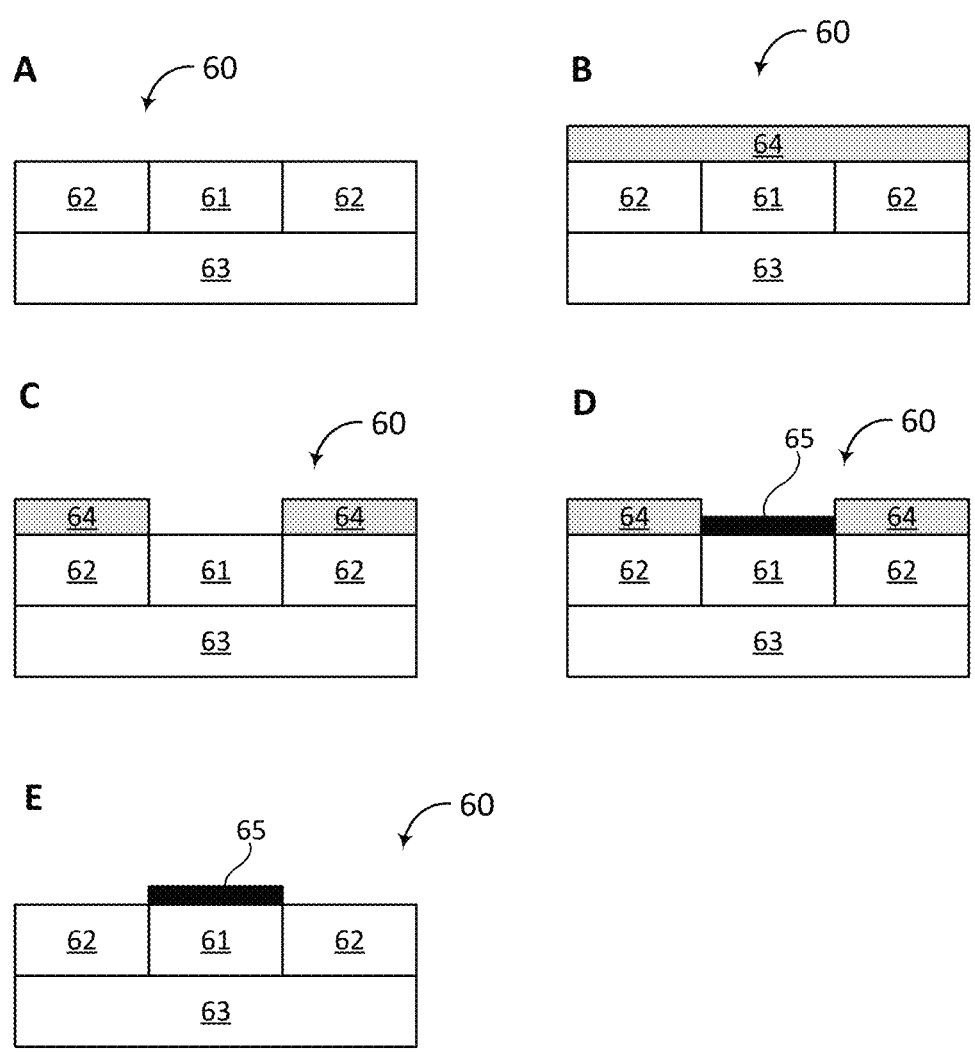
FIG. 6, panels A to E, is a schematic cross sectional diagram illustrating a substrate comprising a first area and a second area, removal of carbon-containing material from the substrate, as well as subsequent selective deposition of a target material on the first area.

In the embodiment of FIG. 6, the first area 61 and the second area 62 are positioned on an underlying material 63. However, a first area 61 and/or a second area 62 may be embedded in the underlying material 63. One or both of the first and second area may comprise the same material as the underlying material 63. The underlying material 63 may be bulk material or a previously formed functional layer. There can be one or more additional underlying layers between the bulk substrate and the first area 61 and/or second area 62. In the embodiment of FIG. 6, first area 61 and second area 62 are depicted to be on the same level. This is for illustration purposes only, and one of the surfaces 61, 62 may be lower than the other. Further, one or both surfaces may comprise features, such as recesses, fins or the like.

In panel B, carbon-containing material 64 has been formed over the substrate 60 comprising the first area 61 and the second area 62. The carbon-containing material may be any material disclosed herein, such as polyimide or PMMA.

Panel C depicts the substrate 60 after carbon-containing material 64 has been removed from the first area 61 selectively. Carbon-containing material 64 remains on the second area 62. Although carbon-containing material 64 is depicted to have the same thickness in panel C as in panel B, in reality, the thickness of remaining carbon-containing material 64 may be reduced during the heat treatment.

Panel D depicts the substrate 60 after target material 65 has been selectively deposited on the first area 61. Carbon-containing material 64 remains on the second area 62. Target material 65 is depicted to be thinner than the carbon-containing material 64 on the second area 62. However, in reality the relative thicknesses of the two materials may be reverse.

Panel E depicts the substrate 60 after carbon-containing material 64 has been removed also from the second area 62. Target material 65 remains on the first area 61. Although target material 65 is depicted to have the same thickness in panel E as in panel D, in reality, the thickness of remaining target material 65 may be reduced during the removal of the carbon-containing material 64 from the second area 62.

The method according to the current disclosure may comprise additional trimming or adjusting procedures known in the art to adjust the selectivity of heat treatment and subsequent deposition of a target material. For example, etching processes, such as plasma etching, may be used. Additionally, especially during the selective deposition of target material, the selective deposition may comprise intermittent etch-back steps to ascertain desired level of selectivity.

Figure 7A:
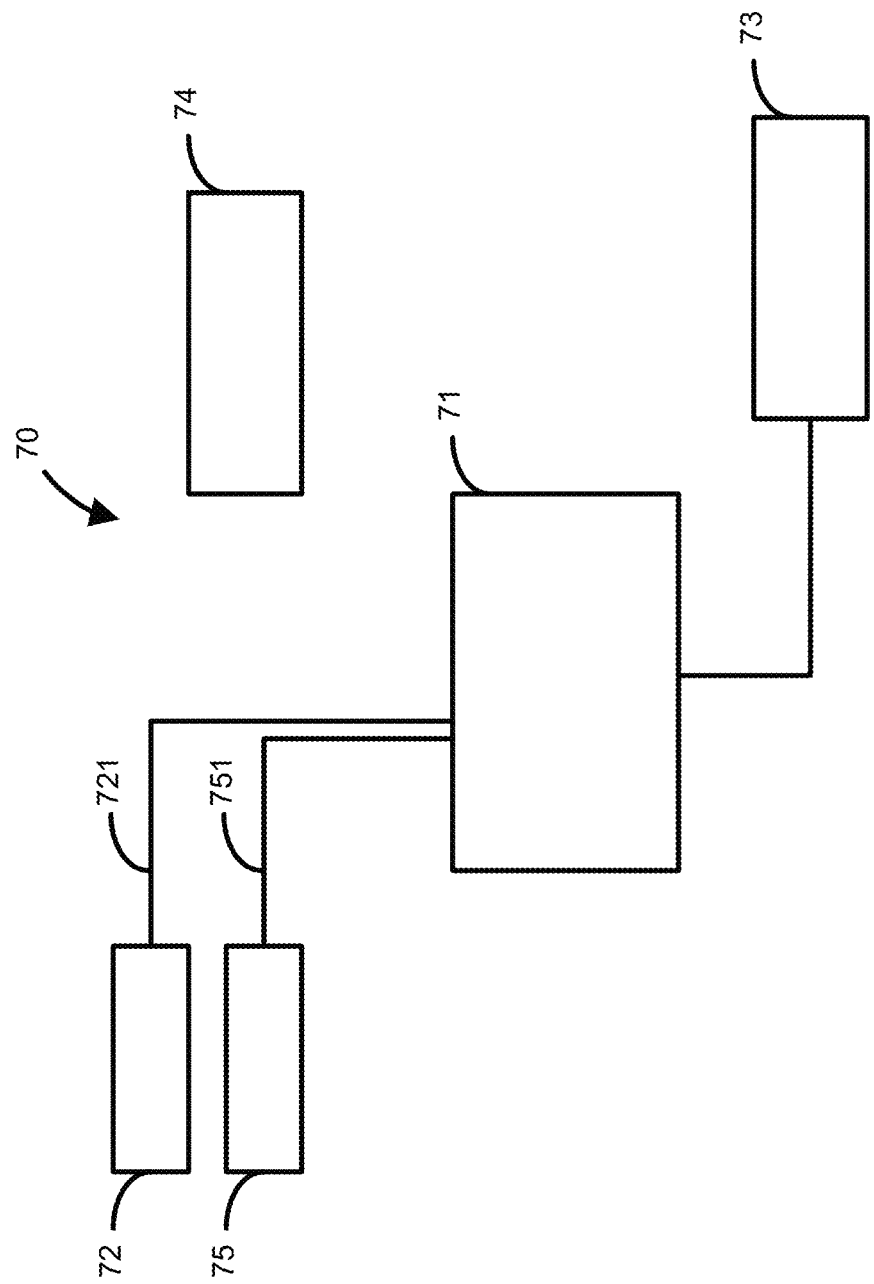
FIGS. 7A and 7B are a schematic block diagrams illustrating embodiments of a system configured and arranged to perform methods according to the current disclosure.

FIG. 7A is a schematic block diagram illustrating a system 70 arranged to perform selective removal of carbon-containing material of the methods disclosed herein. The system 70 is an illustrative example of an apparatus that can perform at least selective removal of carbon-containing material of the methods disclosed herein. The system 70 can also perform other functions, such as forming the carbon-containing material prior to selective removal of carbon-containing material and/or depositing a target material after selective removal of carbon-containing material. As illustrated, the system 70 includes at least one heating station 71, a heating arrangement 72 and a controller 74. In the embodiment of FIG. 7A, the system comprises one or more optional carbon-containing precursor sources 75 connected to the heating station 71 by a precursor delivery line 751, for delivering a carbon-containing precursor for forming a carbon-containing layer according to the current disclosure on the substrate.

The heating station 71 can hold one or more substrates according to the current disclosure and provide an environment for selectively removing carbon-containing material according to the current disclosure. The heating station 71 may have an atmospheric pressure. The heating station 71 may have a reduced pressure. Thus, the removal of carbon-containing material according to the current disclosure may take place at atmospheric pressure. The removal of carbon-containing material according to the current disclosure may take place at a pressure below atmospheric pressure. Removal of carbon-containing material according to the current disclosure may take place at a pressure of about 500 Torr or below, or at a pressure of about 200 Torr or below, or at a pressure of about 100 Torr or below, or at a pressure of about 50 Torr or below, or at a pressure of about 10 Torr or below, or at a pressure of about 1 Torr or below. In some embodiments, removal of carbon-containing material according to the current disclosure may take place at a pressure of about 500 mTorr or below, or at a pressure of about 50 mTorr or below. The heating station according to the current disclosure may comprise an exhaust (not shown) for removing any substances released from the removal of carbon-containing material. Thus, the heating station may be purged from substances released when carbon-containing material is removed from a substrate.

The atmosphere in the heating station 71 may be inert. In some embodiments, the atmosphere in the heating station 71 comprises, consists essentially of, or consists of molecular nitrogen ($N_2$). In some embodiments, the atmosphere in the heating station 71 comprises, consists essentially of, or consists of one or more noble gases, such as argon. In some embodiments, the substrate is heated in an atmosphere comprising, consisting essentially of. In some embodiments, the atmosphere in the heating station 71 comprises, consists essentially of, or consists of molecular nitrogen and noble gases, such as argon. In some embodiments, the atmosphere in the heating station does not contain oxygen.

The system 70 can be a cluster tool with multiple reaction chambers. The system may comprise one or more separate heating stations 71. Alternatively or in addition, one or more reaction chambers may be used as heating stations 71. For example, if a heating station 71 is a reaction chamber, it may be used for forming of carbon-containing material on a substrate, for performing selective carbon-containing material removal, and for depositing target material. Alternatively, separate systems can be used to perform each operation and/or sub-grouping of operations of the methods disclosed herein. Further, in some embodiments, forming carbon-containing material on a substrate, and selectively removing carbon-containing material from the substrate take place in one reaction chamber functioning as a heating station 71. In some embodiments, the heating station 71 may be a reaction chamber in cluster tool that comprises multiple chambers. The heating station 71 may be configured and arranged to perform only a method according to the current disclosure. Alternatively, the heating station 71 may be configured and arranged to perform additional process or processes. The heating station 71 may be an intermediate chamber, such as a loadlock chamber, positioned between other processing chambers and substrate, such as silicon wafer, receiving unit.

The system 70 includes a heating arrangement 72 for heating the substrate in the heating station 71. The design of the heating arrangement 72 may vary according to the system design. For example, substrate support holding the substrate may be heated. Alternatively or in addition, heated gas may be flown into the heating station. In some embodiments, the heating arrangement 72 comprises means for heating the substrate through infrared radiation.

In order to perform a method according to the current disclosure, the system 70 includes a controller 74 in communication with the heating arrangement and configured and arranged to cause the system to heat the substrate in the heating station 71 to remove carbon-containing material from the substrate, and to control conditions of the heating station 71 during heating of the substrate such that a first rate of removal of the carbon-containing material is greater on the first area compared to a second rate of removal of the carbon-containing material on the second area.

The controller 74 can be referred to as a control system. For example, the controller 74 is programmed to cause the system 70 to perform operations of the methods disclosed herein. The controller 74 can comprise a processor and a memory (not shown in the figure). The controller 74 can include specific instructions stored in the memory that, when executed by the processor, cause some or all of the operations of the methods disclosed here to be performed. The controller 74 can include any suitable components known in the industry for controlling processing operations disclosed herein. A general purpose computer can be programmed for use as the controller 74 in certain applications.

The controller 74 can be configured and arranged to control the supply of a carbon-containing precursor to a reaction chamber, which may serve as a heating station 71, from one or more carbon-containing precursor sources 75 via carbon-containing precursor delivery line 751 connected to the heating station 71. For example, the controller 74 can cause valves of the carbon-containing precursor source 75 and/or carbon-containing precursor delivery line 751 to open and/or close to cause the a carbon-containing precursor to be provided to the heating station 71 according to the specific instructions stored in the memory. Thus, the controller 74 can provide a carbon-containing precursor for forming carbon-containing material on the substrate in a reaction chamber functioning as the heating station 71. In some embodiments, the system 70 comprises two carbon-containing precursor sources 75, and respective carbon-containing precursor delivery lines 751.

The controller 74 can be configured to control other operations of the system 70, such as pressure and robotic control, among other operational parameters. The controller can control one or more of these parameters during any operations of the methods disclosed herein.

Figure 7B:
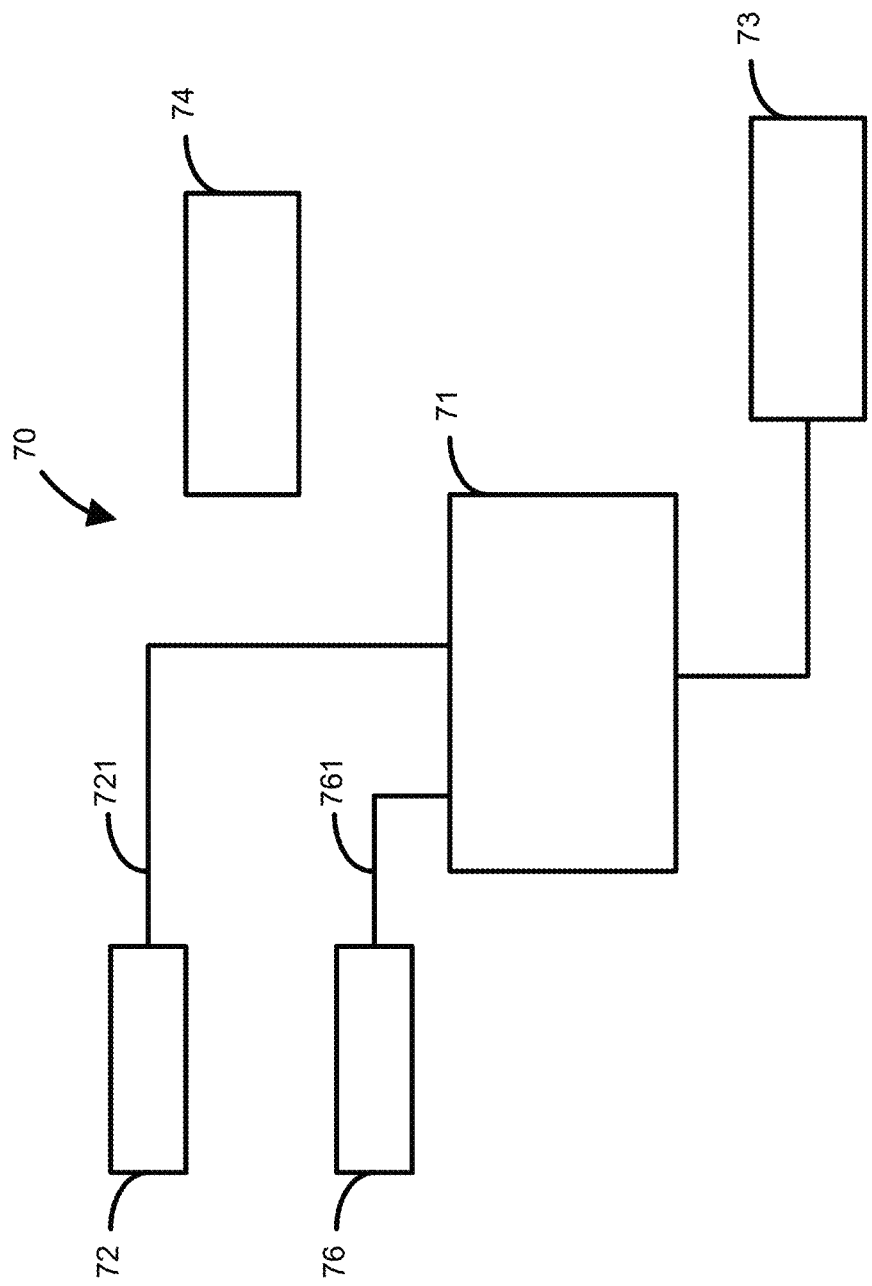

FIG. 7B is a schematic block diagram illustrating another embodiment of a system 70 arranged to perform selective removal of carbon-containing material of the methods disclosed herein. The system 70 of FIG. 7B comprises the same elements as the embodiment of FIG. 7A, except that in the depicted embodiment, the system 70 is configured and arranged to selectively deposit target material on the first area of the substrate after selective removal of carbon-containing material from the first area. Although not depicted, the system 70 of FIG. 7B may be configured to also form carbon-containing material on the substrate. Such embodiments may comprise the related features as described above for FIG. 7A.

In the embodiment of FIG. 7B, the system comprises one or more optional deposition sources 76 connected to the heating station 71 by a material precursor delivery line 761. In the embodiment of FIG. 7B, the heating station 71 is thus a reaction chamber.

The controller 74 can be configured to control the supply of deposition material to a reaction chamber(s) 71 via a deposition source 75 connected to the reaction chamber 71. The reaction chamber can be the same space as the heating station or can be a different chamber in a cluster tool. For example, the controller 74 can cause a valve to open and/or close to cause the deposition reactants to be provided to the reaction chamber according to the specific instructions stored in the memory. Thus, the controller 74 can provide the reactants for deposition after selective removal of material of a carbon-containing layer. The deposition source 75 can provide a precursor for metallic deposition, such as any of the metallic deposition discussed herein. The selective carbon-containing removal and the metallic deposition can both be performed in the same reaction chamber 71 or can be conducted in separate spaces. In one embodiment, the controller 74 can control the system 70 to cycle between exposing to removal agent and deposition reactants.

The system 70 can include more elements than illustrated, such as robotics and pressure control systems, etc., and/or a subset of the illustrated elements in certain instances.

The terms "layer", "film" and "thin film" are used herein for simplicity. "Film", "layer" and "thin film" are meant to mean any continuous or non-continuous structures and material deposited in association with the methods disclosed herein. For example, "layer", "film" and "thin film" could include 2D materials, nanorods, nanotubes or nanoparticles or even single partial or full molecular layers or partial or full atomic layers or clusters of atoms and/or molecules. "Film", "layer" and "thin film" may comprise material or layer with pinholes, but still be at least partially continuous. As used herein, the term "about" means within error of available measurement techniques.

It will be understood by those of skill in the art that numerous and various modifications can be made without departing from the spirit of the present disclosure. The described features, structures, characteristics and reactants can be combined in any suitable manner. Therefore, it should be clearly understood that the embodiments of the present disclosure are illustrative only and are not intended to limit the scope of the present disclosure. All modifications and changes are intended to fall within the scope of the present disclosure.

Although certain embodiments and examples have been discussed, it will be understood by those skilled in the art that the scope of the claims extend beyond the specifically disclosed embodiments to other alternative embodiments and/or uses, modifications and equivalents thereof.

Certain Embodiments According to the Current Disclosure

Embodiment 1: A method of selective organic material removal, the method comprising: providing, in a reaction space, a substrate having a patterned structure thereon and an organic film over first and second areas of the patterned structure, wherein the patterned structure comprises a first material comprising a catalytic material in the first area and a second material of a chemically different composition from the catalytic material in the second area; and exposing the organic layer to a vapor phase reactant in the reaction space such that the vapor phase reactant is activated by the catalytic material of the patterned structure to remove a material of the organic film at a greater rate over the first area compared to a rate of removal of the material of the organic film from over the second area.

Embodiment 2: The method of Embodiment 1, wherein the vapor phase reactant comprises a compound comprising oxygen.

Embodiment 3: The method of Embodiment 2, wherein the vapor phase reactant is $O_2$, and the exposing causes the $O_2$ to dissociate to atomic oxygen that removes the organic film over the first area.

Embodiment 4: The method of Embodiment 1, wherein the vapor phase reactant comprises a compound comprising hydrogen.

Embodiment 5: The method of Embodiment 4, wherein the vapor phase reactant is $H_2$, and the exposing causes the $H_2$ to dissociate to atomic hydrogen for hydrogenolysis to break down the material of the organic film into smaller fragments that desorb from the catalytic material in the first area.

Embodiment 6: The method of any preceding Embodiment, wherein the exposing comprises removing the material of the organic film over the first area at a rate in a range from about 2 to about 36 times the rate of removal of the material of the organic film from over the second area.

Embodiment 7: The method of any preceding Embodiment, wherein the exposing causes the vapor phase reactant to diffuse through the organic film to the patterned structure.

Embodiment 8: The method of any preceding Embodiment, wherein the exposing comprises a thermal removal reaction at a substrate temperature equal to or over about 200° C. and equal to or less than about 500° C. during the exposing.

Embodiment 9: The method of any preceding Embodiment, wherein the exposing comprises a thermal removal reaction at a substrate temperature equal to or over about 200° C. and equal to or less than about 300° C. under ambient atmosphere during the exposing.

Embodiment 10: The method of any preceding Embodiment, wherein the exposing completely removes the material of the organic film over the first area.

Embodiment 11: The method of any preceding Embodiment, wherein the organic film is a blanket layer over the first and second areas prior to the exposing.

Embodiment 12: The method of any preceding Embodiment, wherein the organic film is continuous and covers both the first and second areas.

Embodiment 13: The method of any preceding Embodiment, further comprising forming the organic film over the patterned structure.

Embodiment 14: The method of Embodiment 13, further comprising alternately and sequentially performing the forming and the exposing.

Embodiment 15: The method of any preceding Embodiment, further comprising, after the exposing, selectively depositing a material over the first area such that the second area is substantially free from the deposition.

Embodiment 16: The method of Embodiment 15, wherein the material comprises metal.

Embodiment 17: The method of Embodiment 15, wherein the selectively depositing comprises alternately and sequentially exposing to at least two different reactants.

Embodiment 18: The method of Embodiment 15, wherein the selectively depositing comprises vapor phase deposition.

Embodiment 19: The method of any preceding Embodiment, wherein the catalytic material is a noble metal.

Embodiment 20: The method of any preceding Embodiment, wherein the catalytic material is platinum.

Embodiment 21: The method of any of Embodiments 1 to 18, wherein the catalytic material is ruthenium.

Embodiment 22: The method of any of Embodiments 1 to 18, wherein the catalytic material comprises a metal oxide.

Embodiment 23: The method of any of Embodiments 1 to 18, wherein the catalytic material comprises a soot combustion catalyst.

Embodiment 24: The method of any of Embodiments 1 to 18, wherein the catalytic material is $CeO_2$.

Embodiment 25: The method of any preceding Embodiment, wherein the second material comprises silicon.

Embodiment 26: The method of any preceding Embodiment, wherein the second material is a silicon oxide.

Embodiment 27: The method of any preceding Embodiment, wherein the organic film is a polymer film.

Embodiment 28: The method of any preceding Embodiment, wherein the organic film is a polyimide film.

Embodiment 29: The method of any preceding Embodiment, wherein the organic film is a poly(methyl methacrylate) film.

Embodiment 30: The method of any preceding Embodiment, wherein the substrate is a semiconductor substrate.

Embodiment 31: A system configured for selectively remove an organic material, the system comprising: a reaction chamber configured to hold a substrate, wherein the substrate has a patterned structure thereon and an organic film over first and second areas of the patterned structure, and wherein the patterned structure comprises a first material comprising a catalytic material in the first area and a second material different from the catalytic material in the second area; a removal agent delivery system configured to provide a removal agent capable of chemically removing a material of the organic film to the reaction chamber; and a controller in communication with the reactant delivery system, the controller programmed to cause the system to: expose the organic layer to the reactant in the reaction chamber; and control conditions of the reaction chamber during exposing the organic layer to the removal agent such that a first rate of removal of the material of the organic film is greater in the first area compared to a second rate of removal of the material of the organic film in the second area.

Embodiment 32: The system of Embodiment 31, wherein the controller is programmed to cause the system to perform the method of any preceding Embodiment.

Embodiment 33: A method of selectively removing organic material from a substrate, the method comprising providing a substrate having a first surface and a second surface in a reaction chamber wherein, the first surface and the second surface are chemically different; and the first surface and the second surface are covered with organic material, wherein the first surface comprises removal-enhancing material, and heating the substrate causes the removal-enhancing material to enhance the removal of organic material from the first surface of the substrate relative to the second surface.

Embodiment 34: The method of Embodiment 33, wherein the organic material comprises a polymer.

Embodiment 35: The method of Embodiment 33, wherein the organic material is selected from a group consisting of polyimide, polyamide and poly(methyl methacrylate).

Embodiment 36: The method of Embodiment 33, wherein the removal-enhancing material comprises a transition metal.

Embodiment 37: The method of Embodiment 36, wherein the removal-enhancing material comprises a noble metal.

Embodiment 38: The method of Embodiment 37, wherein the noble metal is selected from platinum metals.

Embodiment 39: The method of Embodiment 36, wherein the removal-enhancing material comprises a transition metal oxide.

Embodiment 40: The method of Embodiment 33, wherein the second surface comprises dielectric material.

Embodiment 41: The method of Embodiment 40, wherein the dielectric material is silicon oxide.

Embodiment 42: The method of Embodiment 40, wherein the dielectric material is a high k material.

Embodiment 43: The method of Embodiment 40, wherein the dielectric material is a high k material.

Embodiment 44: The method of Embodiment 33, wherein the second surface comprises a metal.

Embodiment 45: The method of Embodiment 33, wherein heating the substrate causes the removal-enhancing material to remove organic material from the first surface of the substrate at a rate higher than a rate of removal of organic material from the second surface.

Embodiment 46: The method of Embodiment 33, wherein heating the substrate causes the removal-enhancing material to enhance the removal of organic material from the first surface of the substrate at a rate of at least about 2 times relative to the second surface.

Embodiment 47: The method of Embodiment 33, wherein the substrate is heated at a temperature of from about 200° C. to about 500° C.

Embodiment 48: The method of Embodiment 33, wherein the heating causes the removal of the organic material from over the first surface substantially completely.

Embodiment 49: The method of Embodiment 33, wherein the organic material is substantially continuous and covers both the first surface and the second surface prior to heating the substrate.

Embodiment 50: The method of Embodiment 33, wherein the method further comprises forming the organic material over the substrate prior to heating the substrate to selectively remove organic material from the substrate.

Embodiment 51: The method of Embodiment 50, wherein the organic layer is formed over the substrate by a vapor deposition process.

Embodiment 52: The method of Embodiment 51, wherein the organic material is deposited by providing a first organic precursor and a second organic precursor in a reaction chamber alternately and sequentially.

Embodiment 53: The method of Embodiment 50, wherein the organic material is formed over the substrate by spin-coating, dip-coating, molecular layer deposition, chemical vapor deposition or atomic layer deposition.

Embodiment 54: The method of Embodiment 33, wherein the method further comprises selectively depositing a target material over the first surface relative to the second surface after heating the substrate.

Embodiment 55: The method of Embodiment 54, wherein the target material is deposited by a vapor deposition process.

Embodiment 56: The method of Embodiment 55, wherein the target material is deposited by providing a first material precursor and a second material precursor in the reaction chamber alternately and sequentially.

Embodiment 57: A system configured and arranged to selectively remove organic material from a substrate, the system comprising a reaction chamber configured to hold a substrate, wherein the substrate has a first surface and a second surface, and wherein the first and the second surface are covered with organic material; a heating arrangement configured and arranged to heat the substrate for removing organic material from the substrate; and a controller in communication with the heating arrangement, the controller being programmed to cause the system to: heat the substrate in the reaction chamber to remove organic material from the substrate; and to control conditions of the reaction chamber during heating of the substrate such that a first rate of removal of the organic material is greater on the first surface compared to a second rate of removal of the organic material on the second surface.

Embodiment 58: The system of Embodiment 57, wherein the system is a part of a vapor deposition assembly.

Embodiment 59: The system of Embodiment 58, wherein the reaction chamber is a loadlock chamber.

Embodiment 60: The system of Embodiment 57, wherein the controller is programmed to cause the system to perform the method of Embodiment 1.

What is claimed is:

1. A method of selectively removing carbon-containing material from a substrate, the method comprising:
   providing a substrate in a reaction space, the substrate having a first area of patterned structure, a second area of patterned structure, and a carbon-containing film over the first and the second areas of the patterned structure, wherein the first area of the patterned structure comprises a removal-enhancing material, and wherein the removal-enhancing material comprises at least one of a metal or a combustion catalyst; and
   exposing the substrate to a vapor phase reactant to cause the removal-enhancing material to enhance removal of a portion of the carbon-containing film from over the first area of the patterned structure relative to over the second area of the patterned structure.

2. The method of claim 1, wherein the removal-enhancing material comprises the metal, and the metal is:
   a transition metal;
   a noble metal; or
   included in a metal oxide.

3. The method of claim 1, wherein the removal-enhancing material comprises the combustion catalyst, and wherein the combustion catalyst is a soot combustion catalyst.

4. The method of claim 1, wherein exposing the substrate to the vapor phase reactant comprises exposing the portion of the carbon-containing film to the vapor phase reactant such that the vapor phase reactant is activated by the removal-enhancing material to remove the portion of the carbon-containing film.

5. The method of claim 1, further comprising heating the substrate at a temperature of from about 200° C. to about 500° C.

6. The method of claim 1, wherein exposing the substrate to the vapor phase reactant causes the removal-enhancing material to enhance the removal of the portion of the carbon-containing material from over the first area of the patterned structure at a rate of at least about 2 times relative to a rate of removal over the second area of the patterned structure.

7. The method of claim 1, wherein the first area of the patterned structure comprises a second metal after treating the substrate.

8. The method of claim 1, wherein the second area of the patterned structure comprises a second material, and the second material comprises silicon.

9. The method of claim 1, wherein exposing the substrate to the vapor phase reactant causes the removal of the portion of the carbon-containing film from over the first area substantially completely.

10. The method of claim 1, wherein the carbon-containing film comprises a polymer.

11. The method of claim 1, wherein the carbon-containing film is substantially continuous and covers both the first area of the patterned structure and the second area of the patterned structure prior to treating the substrate.

12. The method of claim 1, further comprising selectively depositing a target material over the first area of the patterned structure relative to over the second area of the patterned structure after treating the substrate.

13. The method of claim 12, wherein selectively depositing the target material comprises metallic deposition.

14. The method of claim 1, wherein the vapor phase reactant comprises at least one of $O_2$, $N_2O$, $H_2O$, $H_2$, $H_2O_2$, $N_2H_4$, $NH_3$, $NR_{3-x}H_x$, $PH_3$, or $AsH_3$.

15. A method of selectively removing carbon-containing material from a substrate, the method comprising:
providing a substrate in a reaction space, the substrate having a first area of patterned structure, a second area of patterned structure, and a film comprising carbon over the first and the second areas of the patterned structure, wherein the first area of the patterned structure comprises a removal-enhancing material, and wherein the removal-enhancing material comprises a metal; and
heating the substrate to cause the removal-enhancing material to cause a portion of the film from over the first area of the patterned structure to be removed at a greater rate relative to a rate of removal of another portion of the film from over the second area of the patterned structure.

16. The method of claim 15, wherein heating the substrate comprises heating the substrate at a temperature of from about 200° C. to about 500° C.

17. The method of claim 15, further comprising:
after heating the substrate, selectively depositing a target material over the first area of the patterned structure relative to over the second area of the patterned structure, wherein selectively depositing the target material comprises metallic deposition.

18. A method of selectively removing carbon-containing material from a substrate, the method comprising:
providing a substrate in a reaction space, the substrate having a first area of patterned structure, a second area of patterned structure, and a film comprising carbon over the first and the second areas of the patterned structure, wherein the first area of the patterned structure comprises a removal-enhancing material, and wherein the removal-enhancing material comprises a soot combustion catalyst; and
heating the substrate to cause the removal-enhancing material to cause a portion of the film from over the first area of the patterned structure to be removed at a greater rate relative to a rate of removal of another portion of the film from over the second area of the patterned structure.

19. The method of claim 18, wherein heating the substrate comprises heating the substrate at a temperature of from about 200° C. to about 500° C.

20. The method of claim 18, further comprising:
after heating the substrate, selectively depositing a target material over the first area of the patterned structure relative to over the second area of the patterned structure, wherein selectively depositing the target material comprises metallic deposition.

* * * * *